(12) United States Patent
Yokai et al.

(10) Patent No.: US 8,310,194 B2
(45) Date of Patent: Nov. 13, 2012

(54) LOAD DRIVE DEVICE AND CONTROL SYSTEM OF THE SAME

(75) Inventors: Masatoshi Yokai, Kariya (JP); Satoshi Yoshimura, Kariya (JP); Kouji Nakamura, Toyohashi (JP); Masao Yamada, Kariya (JP)

(73) Assignee: DENSO CORPORATION, Kariya (JP)

( * ) Notice: Subject to any disclaimer, the term of this patent is extended or adjusted under 35 U.S.C. 154(b) by 614 days.

(21) Appl. No.: 12/458,915

(22) Filed: Jul. 28, 2009

(65) Prior Publication Data

US 2010/0026355 A1 Feb. 4, 2010

(30) Foreign Application Priority Data

Jul. 30, 2008 (JP) ................................. 2008-196220
May 20, 2009 (JP) ................................. 2009-121958

(51) Int. Cl.
*G05B 11/28* (2006.01)
(52) U.S. Cl. ........................................ 318/599; 318/811
(58) Field of Classification Search .................. 318/599, 318/811, 45, 85, 112, 700
See application file for complete search history.

(56) References Cited

U.S. PATENT DOCUMENTS

| 5,004,961 | A | * | 4/1991 | Berner et al. | 318/65 |
| 5,397,942 | A | * | 3/1995 | Yamada | 326/82 |
| 6,016,965 | A | * | 1/2000 | Yoshimura et al. | 236/35 |
| 6,676,400 | B2 | * | 1/2004 | Ito | 425/145 |
| 6,891,342 | B2 | * | 5/2005 | Nakamura et al. | 318/77 |
| 6,919,704 | B1 | * | 7/2005 | Healey | 318/599 |
| 7,109,670 | B1 | * | 9/2006 | Rehm | 318/68 |
| 2004/0027105 | A1 | | 2/2004 | Nakamura et al. | |

FOREIGN PATENT DOCUMENTS

| JP | A-9-289979 | 11/1997 |
| JP | A-11-46479 | 2/1999 |
| JP | A-2002-291255 | 10/2002 |
| JP | A-2004-312922 | 11/2004 |

OTHER PUBLICATIONS

English translation corresponding to JP-11-046479, Apr. 3, 2012, pp. 1-6.*
Office Action mailed Jul. 12, 2010 from the Japanese Patent Office in the corresponding JP Patent Application No. 2009-121958 (English translation).

* cited by examiner

*Primary Examiner* — Rina Duda
(74) *Attorney, Agent, or Firm* — Posz Law Group, PLC

(57) ABSTRACT

A load drive device for driving an inductive load by PWM controlling a switching element includes synchronization control unit, a synchronization signal input terminal, and a synchronization signal output terminal. The synchronization control unit outputs the PWM signal to the switching element. The synchronization control unit receives a synchronization signal through the input terminal from an exterior. The synchronization control unit outputs the synchronization signal through the output terminal to an exterior. When the synchronization control unit does not receive the synchronization signal, the synchronization control unit outputs the synchronization signal such that a first switching period of the PWM signal is prevented from overlapping with a second switching period of a PWM signal of an external device. When the synchronization control unit receives the synchronization signal, the synchronization control unit generates the PWM signal based on the synchronization signal.

6 Claims, 23 Drawing Sheets

FIG. 5

| ITEM NUMBER | INPUT | | | OUTPUT | |
|---|---|---|---|---|---|
| | SYNCHRONOUS CONNECTION | SI INPUT | | 1A (MASTER) | 1B (SLAVE) |
| | | 1A (MASTER) | 1B (SLAVE) | | |
| (1) | — | — | — | — | — |
| (2) | — | ○ | — | NORMAL CONTROL | — |
| (3) | — | — | ○ | — | NORMAL CONTROL |
| (4) | — | ○ | ○ | NORMAL CONTROL | NORMAL CONTROL |
| (5) | ○ | — | — | — | — |
| (6) | ○ | ○ | — | SYNC. CONTROL | |
| (7) | ○ | — | ○ | — | NORMAL CONTROL |
| (8) | ○ | ○ | ○ | SYNC. CONTROL | |

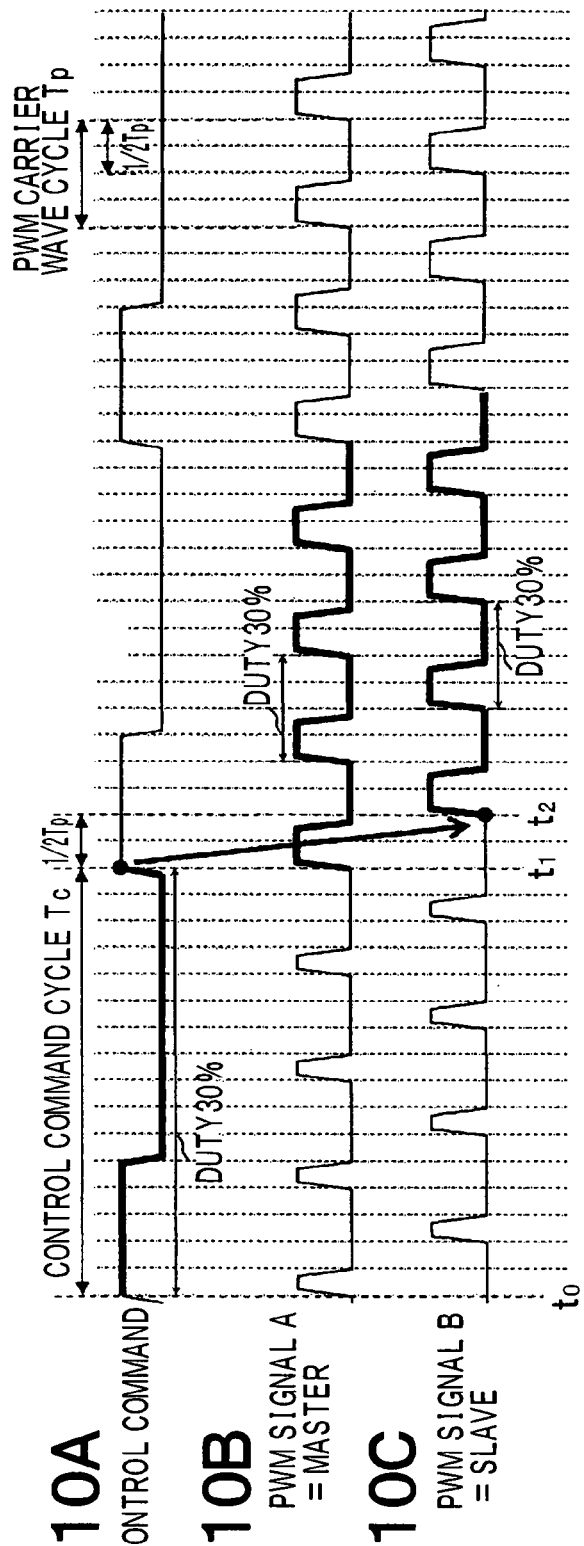

FIG. 11

| ITEM NUMBER | INPUT | | | | OUTPUT | | NOTE |
|---|---|---|---|---|---|---|---|
| | SYNCHRONIZATION SETTING TERMINAL (M/S) | | SI INPUT | | 1A | 1B | |
| | M/SA | M/SB | SIA | SIB | | | |
| (1) | L | L | × | × | — | — | |
| (2) | L | L | ○ | × | NORMAL CONTROL | — | |
| (3) | L | L | × | ○ | — | NORMAL CONTROL | |
| (4) | L | L | ○ | ○ | NORMAL CONTROL | NORMAL CONTROL | OVERLAP OF PWM SWITCHING |
| (5) | L | H | × | × | — | — | |
| (6) | L | H | ○ | × | NORMAL CONTROL | — | |
| (7) | L | H | × | ○ | — | NORMAL CONTROL | |
| (8) | L | H | ○ | ○ | SYNC. CONTROL | | SYNC. CONTROL WITH DEVICE 1B AS MASTER |
| (9) | H | L | × | × | — | — | |
| (10) | H | L | ○ | × | NORMAL CONTROL | — | |
| (11) | H | L | × | ○ | — | NORMAL CONTROL | |
| (12) | H | L | ○ | ○ | SYNC. CONTROL | | SYNC. CONTROL WITH DEVICE 1A AS MASTER |
| (13) | H | H | × | × | — | — | |
| (14) | H | H | ○ | × | NORMAL CONTROL | — | |
| (15) | H | H | × | ○ | — | NORMAL CONTROL | |
| (16) | H | H | ○ | ○ | NORMAL CONTROL | NORMAL CONTROL | OVERLAP OF PWM SWITCHING |

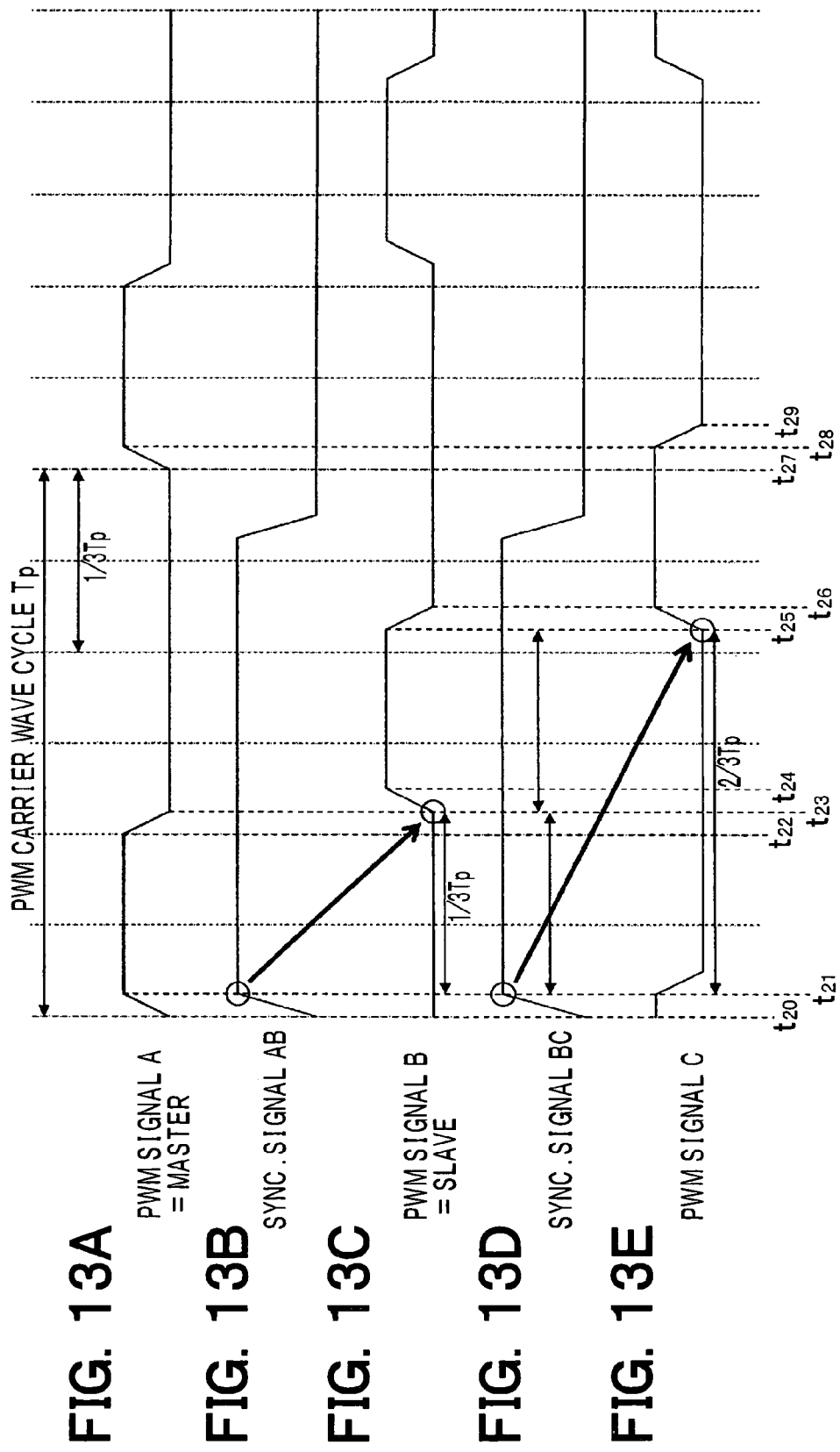

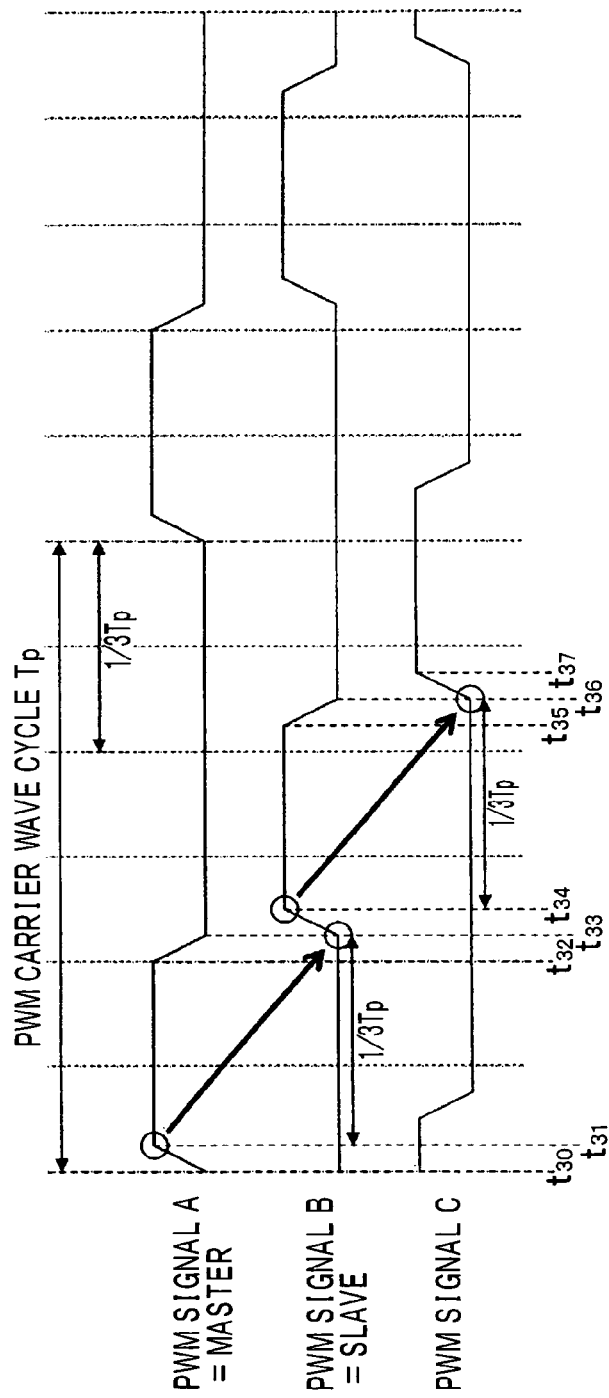

CONTROL COMMAND

PWM SIGNAL A

PWM SIGNAL B

FIG. 20A CONTROL COMMAND
FIG. 20B MOS GATE SIGNAL WAVEFORM OF DEVICE 35A
FIG. 20C MOS GATE SIGNAL WAVEFORM OF DEVICE 35B
FIG. 20D MOS GATE SIGNAL WAVEFORM OF DEVICE 35C
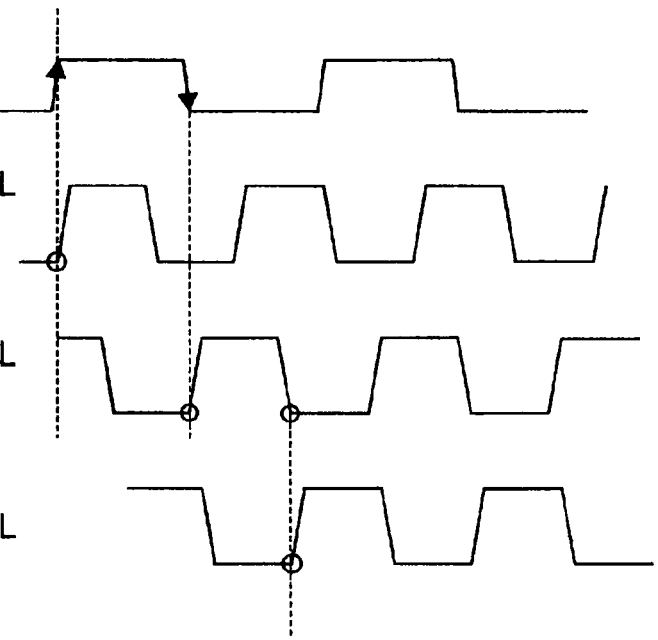
FIG. 21A MOS GATE SIGNAL WAVEFORM OF DEVICE 35B
FIG. 21B MOS GATE SIGNAL WAVEFORM OF DEVICE 35C
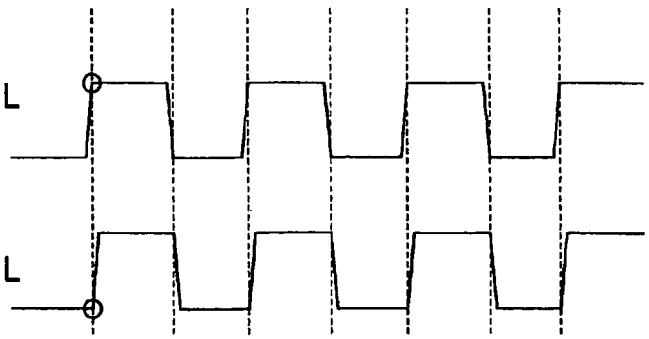

MOS GATE SIGNAL
WAVEFORM OF
DEVICE 35B

MOS GATE SIGNAL
WAVEFORM OF
DEVICE 35C

MOS GATE SIGNAL
WAVEFORM OF
DEVICE 35D

LOAD DRIVE DEVICE AND CONTROL SYSTEM OF THE SAME

CROSS REFERENCE TO RELATED APPLICATION

This application is based on and incorporates herein by reference Japanese Patent Application No. 2008-196220 filed on Jul. 30, 2008 and Japanese Patent Application No. 2009-121958 filed on May 20, 2009.

BACKGROUND OF THE INVENTION

1. Field of the Invention

The present invention relates to an inductive load drive device that drives an inductive load by PWM control of a switching element that is provided in series with the inductive load between a power source and a ground. Also, the present invention relates to a control system, which includes multiple load drive devices, and which executes a synchronization control of the multiple load drive devices.

2. Description of Related Art

JP-A-2004-72592 discloses a technique, in which two motors serving as inductive loads are operated under PWM control by a drive device, and in which PWM signals, which are out of phase from each other, are outputted from both FETs for the motors in order to prevent overlap of switching periods of the FETs, and thereby the generation of ripple to the power source electric current is limited.

However, in the technique of JP-A-2004-72592, one circuit is required to drive the two motors, and thereby flexibility of size and layout of the substrate of the circuit is limited. Also, it is not easy to increase the number of the motors that are targets for the drive control.

SUMMARY OF THE INVENTION

The present invention is made in view of the above disadvantages. Thus, it is an objective of the present invention to address at least one of the above disadvantages.

To achieve the objective of the present invention, there is provided a load drive device for driving an inductive load by controlling a switching element based on a pulse width modulation (PWM) signal, wherein the switching element is provided in series with the inductive load between a power source and a ground, the load drive device including synchronization control means, a synchronization signal input terminal, and a synchronization signal output terminal. The synchronization control means outputs the PWM signal to the switching element. The synchronization control means is adapted to receive a synchronization signal from an exterior through the synchronization signal input terminal. The synchronization control means is adapted to output the synchronization signal to an exterior through synchronization signal output terminal. When the synchronization control means does not receive the synchronization signal through the synchronization signal input terminal, the synchronization control means outputs the synchronization signal through the synchronization signal output terminal such that a first switching period of the PWM signal outputted to the switching element is prevented from overlapping with a second switching period of a PWM signal of an external device. When the synchronization control means receives the synchronization signal through the synchronization signal input terminal, the synchronization control means generates the PWM signal that is outputted to the switching element based on the synchronization signal.

To achieve the objective of the present invention, there is also provided a load drive device for driving an inductive load by controlling a switching element based on a pulse width modulation (PWM) signal, wherein the switching element is provided in series with the inductive load between a power source and a ground, the load drive device including synchronization control means, a synchronization signal input terminal, a synchronization setting terminal, and phase shifting means. The synchronization control means generates the PWM signal that is outputted to the switching element. The synchronization control means receives a synchronization signal through the synchronization signal input terminal. The synchronization control means receives a setting signal through the synchronization setting terminal. The phase shifting means shifts a phase of the PWM signal. The synchronization control means determines whether the synchronization control means serves as a master and a slave in a synchronization control based on the setting signal. When the synchronization control means serves as the slave in the synchronization control, the phase shifting means shifts the phase of the PWM signal by a phase shift amount such that a first switching period of the PWM signal that is outputted to the switching element is prevented from overlapping with a second switching period of an external device. When the synchronization control means serves as the master in the synchronization control, the synchronization control means generates the PWM signal such that a leading edge of the PWM signal coincides with a leading edge of the synchronization signal.

To achieve the objective of the present invention, there is also provided a control system that includes a plurality of load drive devices and synchronization means. Each of the plurality of load drive devices drives,a corresponding inductive load by controlling a corresponding switching element based on a pulse width modulation (PWM) signal. The corresponding switching element is provided in series with the corresponding inductive load between a power source and a ground. The control system controls the plurality of load drive devices in a synchronization control. The synchronization means provides a common synchronization signal that is inputted into each of the plurality of load drive devices. Each of the plurality of load drive devices includes phase shifting means for providing a phase difference to the PWM signal that is outputted to the corresponding switching element based on the common synchronization signal such that a plurality of switching periods of the PWM signals, each of which is outputted to the corresponding switching element of each of the plurality of load drive devices, is prevented from overlapping with each other.

To achieve the objective of the present invention, there is also provided a control system that includes a plurality of load drive devices. Each of the plurality of load drive devices drives a corresponding inductive load by controlling a corresponding switching element based on a pulse width modulation (PWM) signal. The corresponding switching element is provided in series with the corresponding inductive load between a power source and a ground. The control system synchronously controls the plurality of load drive devices in a synchronization control. A first one of the plurality of load drive devices serves as a master in the synchronization control. Second and third ones of the plurality of load drive devices serves as slaves in the synchronization control. The first one of the plurality of load drive devices outputs a synchronization signal to the second one of the plurality of load drive devices such that a switching period of the PWM signal of the first one of the plurality of load drive devices is prevented from overlapping with a switching period of the second one of the plurality of load drive devices. The second one of the plurality of load drive devices generates the PWM signal, which is outputted to the corresponding switching element of the second one of the plurality of load drive devices, based on the synchronization signal received from the first one of the plurality of load drive devices. The second one of the plurality of load drive devices outputs a specific signal to the third one of the plurality of load drive devices, the specific signal being equivalent to the synchronization signal received from the first one of the plurality of load drive devices.

To achieve the objective of the present invention, there is also provided a control system that includes a plurality of load drive devices. Each of the plurality of load drive devices drives a corresponding inductive load by controlling a corresponding switching element based on a pulse width modulation (PWM) signal. The corresponding switching element is provided in series with the corresponding inductive load between a power source and a ground. The control system controls the plurality of load drive devices in a synchronization control. A first one of the plurality of load drive devices has a signal input terminal, through which the first one of the plurality of load drive devices receives a command PWM signal from an exterior. The first one of the plurality of load drive devices is operated synchronously with an end of one of a leading edge and a trailing edge of the command PWM signal. A second one of the plurality of load drive devices has a signal input terminal, through which the second one of the plurality of load drive devices receives the command PWM signal from the exterior. The second one of the plurality of load drive devices is operated synchronously with an end of the other one of the leading edge and the trailing edge of the command PWM signal.

To achieve the objective of the present invention, there is also provided a control system that includes a plurality of load drive devices. Each of the plurality of load drive devices drives a corresponding inductive load by controlling a corresponding switching element based on a pulse width modulation (PWM) signal. The corresponding switching element is provided in series with the corresponding inductive load between a power source and a ground. The control system controls the plurality of load drive devices in a synchronization control. A first one of the plurality of load drive devices has a signal input terminal, through which the first one of the plurality of load drive devices receives a command signal from an exterior. The first one of the plurality of load drive devices controls the corresponding switching element based on the PWM signal in accordance with the received command signal. The first one of the plurality of load drive devices has a signal output terminal, through which one of (a) the PWM signal outputted to the corresponding switching element and (b) a voltage signal outputted to the corresponding inductive load is outputted. A second one of the plurality of load drive devices has a signal input terminal that is in a serial connection with the signal output terminal of the first one of the plurality of load drive devices. The second one of the plurality of load drive devices controls the corresponding switching element synchronously with an end of one of leading and trailing edges of the one of (a) the PWM signal and (b) the voltage signal outputted through the signal output terminal of the first one of the plurality of load drive devices.

BRIEF DESCRIPTION OF THE DRAWINGS

The invention, together with additional objectives, features and advantages thereof, will be best understood from the following description, the appended claims and the accompanying drawings in which:

FIG. 5 is a diagram illustrating operational examples for operating the two motor control devices of FIG. 1;

FIGS. 10A to 10C are diagrams each illustrating a PWM signal waveform when the two control devices are operated under the synchronization control based on a control command of a motor according to the third embodiment;

FIG. 11 is a diagram illustrating operational examples for operating the two motor control devices of FIG. 9;

FIGS. 13A to 13E are diagrams each illustrating a PWM signal waveform when three control devices are operated under the synchronization control based on a control command of a motor according to the fourth embodiment;

FIGS. 14A to 14C are diagrams each illustrating a PWM signal waveform when the three control devices are operated under the synchronization control based on the control command of the motor according to the first modification of the fourth embodiment;

FIGS. 20A to 20D are diagrams each illustrating a PWM signal waveform when three control devices are operated under the synchronization control based on a control command of a motor;

FIGS. 21A and 21B are diagrams each illustrating a PWM signal waveform in an alternative operation according to the sixth embodiment;

DETAILED DESCRIPTION OF PREFERRED EMBODIMENTS (First Embodiment)

Figure 1:
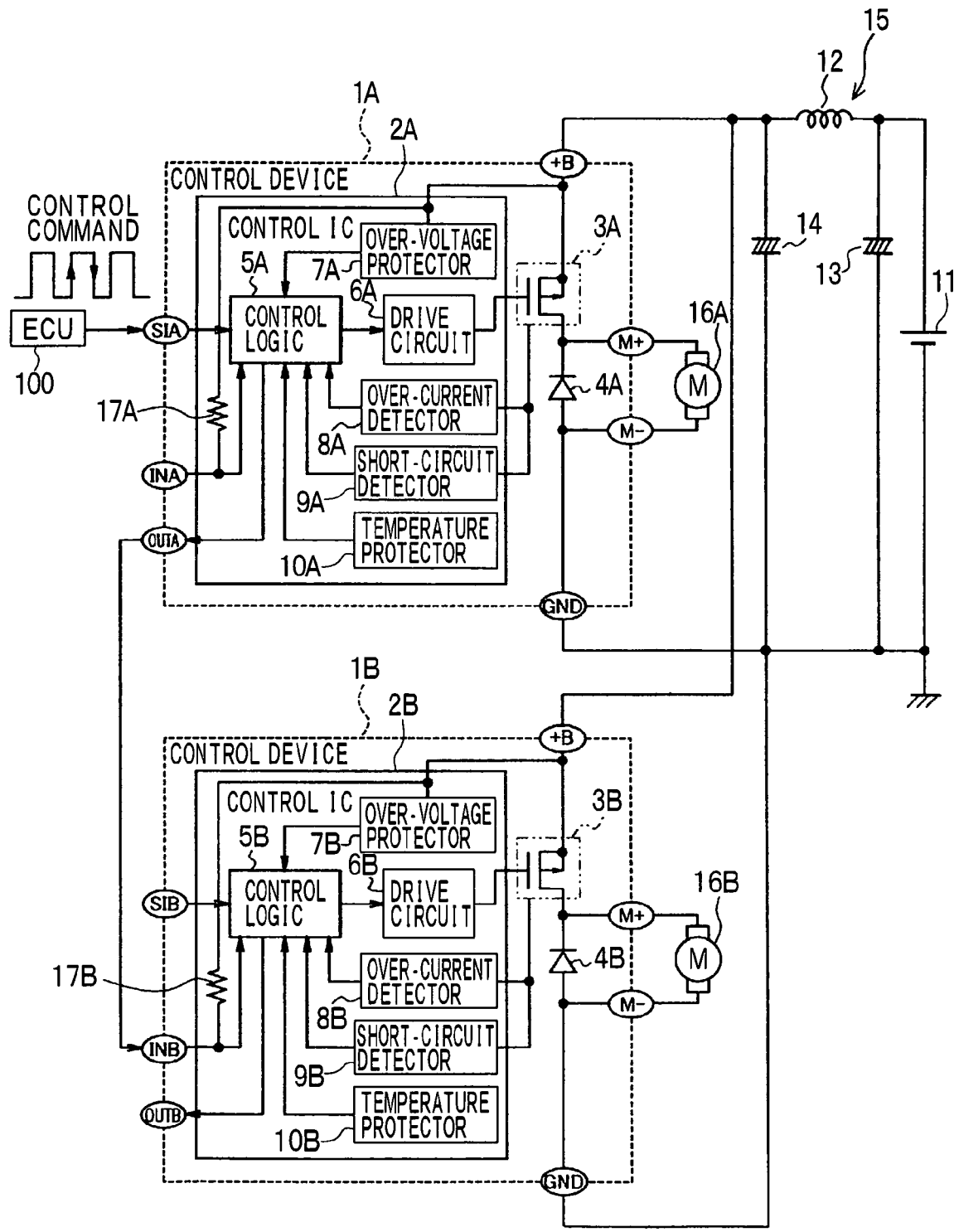
FIG. 1 is a diagram illustrating a control system having two motor control devices according to the first embodiment of the present invention.

The first embodiment of the present invention will be described with reference to FIGS. 1 to 5. FIG. 1 shows a control system having two motor control devices. Each motor control device 1 (each of the motor control devices 1A, 1B) serving as a load drive device is a series circuit having a control IC 2, a FET 3, and a free wheel diode 4. The FET 3 serves as a switching element and is located between a terminal +B (battery terminal) and a ground (GND). In other words, the motor control device 1A has the control IC 2A, the FET 3A, and the free wheel diode 4A, and controls the motor 16A.

Also, the motor control device 1B includes the control IC 2B, the FET 3B, and the free wheel diode 4B, and controls the motor 16B. As above, for example, the FET 3 is a general term for the FET 3A and FET 3B in the description of the present specification. In the description below, although different reference numerals are given to the motor control device 1A and the motor control device 1B for facilitating the explanation, the motor control device 1A and the motor control device 1B have mutually similar internal configuration. Also, in the description below, the motor control device 1A is employed as a master, and the motor control device 1B is employed as a slave that depends on the motor control device 1A. However, in an alternative connection configuration, the motor control device 1A may be employed as a slave, and the motor control device 1B may be employed as a master. Also, the FET 3A, 3B may employ a P-channel MOSFET.

Each of the control ICs 2A, 2B mainly includes a control logic 5A, 5B serving as synchronization control means and a drive circuit 6A, 6B, respectively. Each of the control logics 5A, 5B is capable of receiving a control command, which is a PWM signal, through a control command input terminal SIA, SIB, respectively, from an external ECU 100. Each of the control logics 5A, 5B outputs a PWM signal to a gate of the FET 3A, 3B through the drive circuit 6A, 6B based on the received control command. In the above case, the control logic 5A, 5B is capable of generating a trapezoidal-wave signal, similar to JP-A-2004-72592, such that the signal changes gently at a leading edge and a trailing edge of the PWM signal. It should be noted that in the example of FIG. 1, the control command input terminal SIA of the control logic 5A is connected with the external ECU in the present embodiment.

Also, each of the control ICs 2A, 2B has various protectors and detectors, such as an over-voltage protector 7A, 7B, an over-current detector 8A, 8B, a short-circuit detector 9A, 9B, a temperature protector 10A, 10B, respectively, and the output signal outputted from the above protectors and detectors are provided to the corresponding control logic 5A, 5B.

Both the motor control devices 1A, 1B have the terminals +B that are connected with a positive terminal of a battery 11 (power source) through a π filter 15 that includes a coil 12 and capacitors 13, 14. Also, GND terminals of the motor control devices 1A, 1B are grounded. A cathode and an anode of each free wheel diode 4A, 4B are connected with terminals M+, M− of each motor control device 1A, 1B, respectively, and each of the motors 16A, 16B (inductive load) is in electrical connection with the corresponding terminals M+, M−.

Also, each control logics 5 has a synchronization signal input terminal IN and a synchronization signal output terminal OUT. The control logic 5 of the motor control device 1 of interest serves as the master of the synchronization control in a condition, where the control logic 5 receives a control command (input signal) through the control command input terminal SI, and simultaneously where the synchronization signal input terminal IN of the motor control device 1 does not receive a synchronization signal. In the above case, the control logic 5 outputs the synchronization signal to the other motor control device 1, which serves as the slave, through the synchronization signal output terminal OUT of the motor control 1 of interest. In the example of FIG. 1, because the control command (input signal) is given to the control command input terminal SIA of the motor control device 1A, the control logic 5A drives as the master of the synchronization control, and outputs the synchronization signal through the synchronization signal output terminal OUTA to the motor control device 1B (the other motor control device 1).

When the synchronization signal input terminal INA, INB receives the synchronization signal, the control logic 5 of the motor control device 1 serves as the slave and is operated under the synchronization control based on the synchronization signal. Also, the control logic 5 is capable of outputting the synchronization signal to still the other motor control device 1, which serves as the other slave, through the synchronization signal output terminal OUT. In the example of FIG. 1, because the synchronization signal is given to the synchronization signal input terminal INB of the motor control device 1B, the control logic 5B drives as the slave of the synchronization control, and outputs the synchronization signal through the synchronization signal output terminal OUTB. However, in FIG. 1, the synchronization signal output terminal OUTB of the motor control device 1B is not connected with any device that is located downstream of the motor control device 1B, and thereby the synchronization signal outputted through the synchronization signal output terminal OUTB is not utilized.

It should be noted that as shown in FIG. 1, one end of each of pull-up resistors 17A, 17B is connected with a position between the corresponding synchronization signal input terminal INA, INB and the corresponding control logic 5A, 5B. The other end of the pull-up resistor 17A, 17B is connected with the terminal +B of the motor control device 1A, 1B. Thus, the control logic 5A, 5B is capable of detecting whether the synchronization signal input terminal INA, INB is connected with the corresponding synchronization signal output terminal OUTA, OUTB. Then, two motor control devices 1A, 1B are connected in parallel with each other between the output side of the π filter 15 and the ground.

Figure 2:
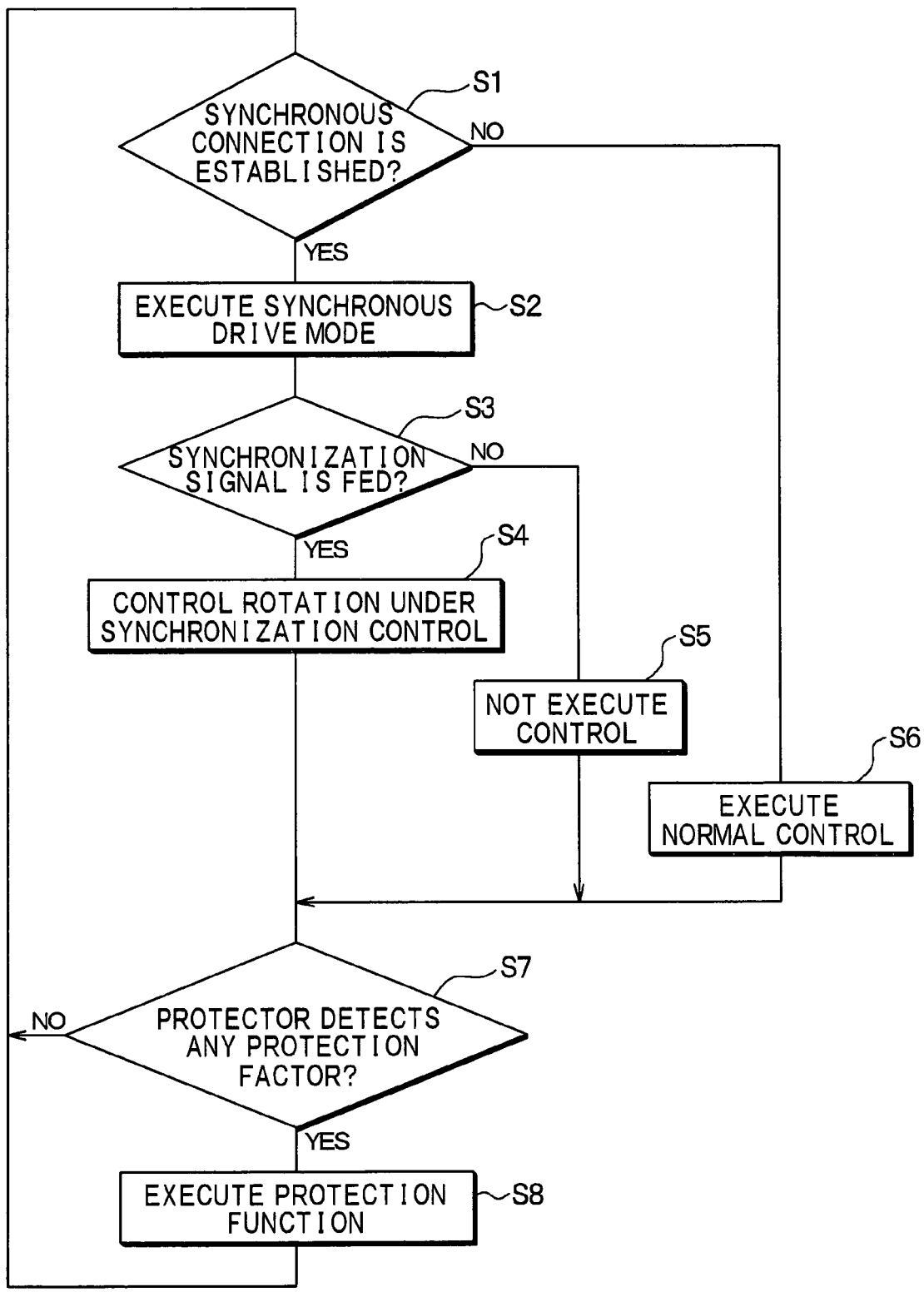
FIG. 2 is a flow chart schematically illustrating a control process of a control logic.
Figure 3:
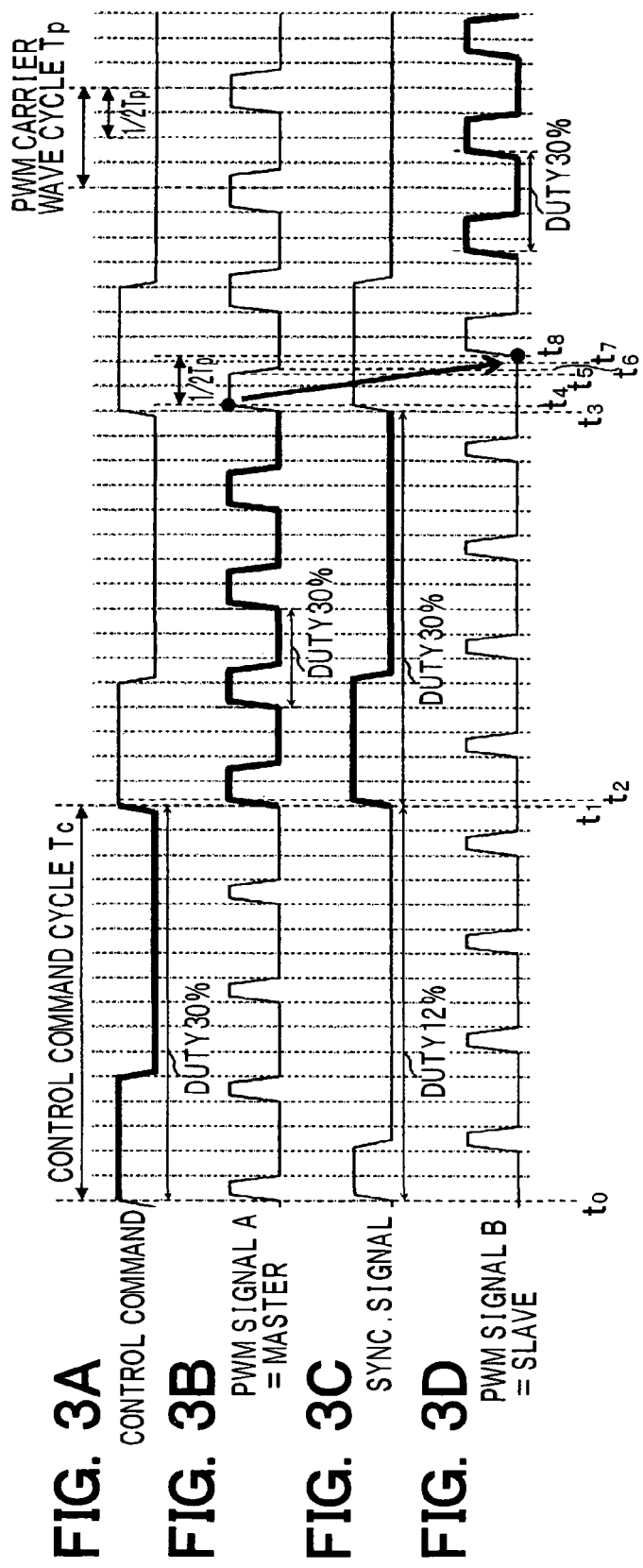
FIGS. 3A to 3D are diagrams each illustrating a PWM signal waveform when two control devices are operated under a synchronization control based on a control command of a motor.
Figure 4:
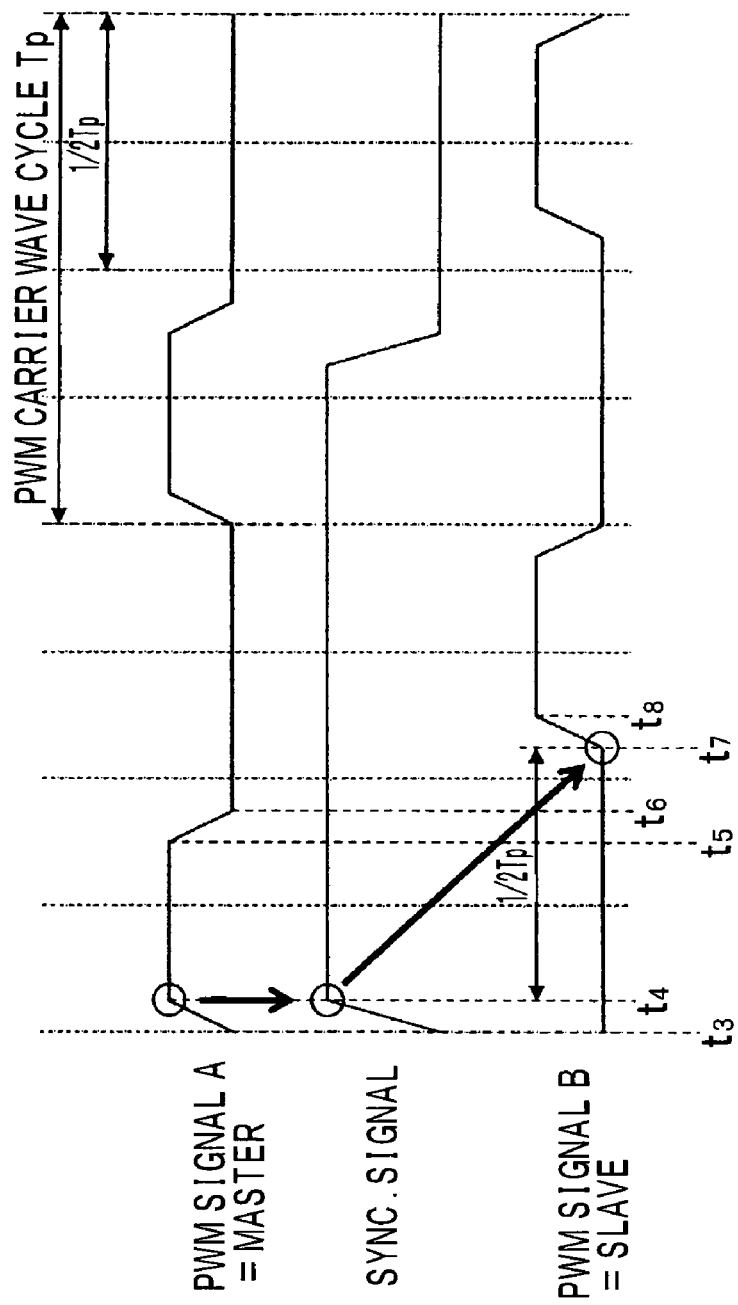
FIG. 4A is an enlarged view of part of FIG. 3B when a duty ratio is 30%.
FIG. 4B is an enlarged view of part of FIG. 3C when the duty ratio is 30%.
FIG. 4C is an enlarged view of part of FIG. 3D when the duty ratio is 30%.

Next, an operation of the present embodiment will be described with reference to FIG. 2 and FIG. 3. FIG. 2 is a flow chart schematically illustrating control by the control logics 5A, 5B. To avoid repetitive disclosure, the example case will be described by referring only to the control logic 5A, because the control logic 5A and the control logic 5B, which has the same configuration with the control logic 5A, operate in the same manner.

When the control logic 5A of the motor control device 1A confirms at step S1 that a synchronization signal input terminal INA is not connected with a synchronization signal output terminal OUT of the other motor control device 1 and also confirms that the control logic 5A is not fed with a synchronization signal (corresponding to NO at S1), the normal control is operated at step S6. In other words, when it is determined at step S1 that a signal to the synchronization signal input terminal INA is kept constantly high level due to the pull-up resistor 17A, the determination at step S1 corresponds to "NO".

In the above "normal control", the motor control device 1 of interest (motor control device 1A) is not operated under the synchronization control synchronously with the other motor control device 1. Thus, the motor control device 1 of interest (motor control device 1A) is operated to drive the motor 16A in accordance with control commands fed through the control command input terminal SIA in a known manner. However, even in the above normal control, the control command is outputted through the synchronization signal output terminal OUTA, and thereby the motor control device 1 of interest (motor control device 1A) is capable of serving as a master of the other device. It should be noted that the "normal control" includes a termination control, in which the rotation of the motor 16A is stopped based on the control command that indicates the stopping of the motor 16A. For example, a duty ratio of the PWM control command indicates zero.

In contrast, at step S1, when it is confirmed that the synchronization signal input terminal INA is connected to the synchronization signal output terminal OUT of the other motor control device 1 and that the synchronization signal is fed to the control logic 5A (corresponding to YES at S1), a "synchronous drive mode" is executed at step S2. In other words, the control logic 5A of the motor control device 1A is operated as the slave of the synchronization control, and thereby the control logic 5A is operated based on the fed synchronization signal (YES at step S3) under the synchronization control with the other motor control device 1 such that the rotation of the motor 16A is controlled at step S4. The operation will be described later. Also, in the synchronous drive mode, when the synchronization signal is not inputted or fed to the control logic 5A, corresponding to NO at step S3, the control logic 5A stops the rotation control of the motor 16A (step S5).

After the execution of steps S4 to S6, it is determined at step S7 whether the various protectors, such as the overvoltage protector 7A or the temperature protector 10A, and the detector detect any protection factor. When it is determined that the protection factor is detected, corresponding to YES at S7, the corresponding protection function will be executed at step S8.

Because the control logic 5A shown in FIG. 1 serves as the master of the synchronization control, control proceeds in the order of S1→S6→S7→(S8)→S1 in the flow chart of FIG. 2. In contrast, because the control logic 5B serves as the slave of the synchronization control, control proceeds in the order of S1→S2→S3→S4→S7→(S8)→S1 in the flow chart of FIG. 2 if the motor control device 1A serving as the master normally feeds the synchronization signal to the motor control device 1B.

Hereinafter, time change of a PWM signal A, a synchronization signal, and a PWM signal B at a time of inputting the control command into the motor control device 1A will be described by referring to FIGS. 3A to 3D and FIGS. 4A to 4C. FIGS. 3A to 3D show PWM signal waveforms when two motor control devices 1A, 1B are controlled under the synchronization control based on the control command that is inputted to the motor control device 1A. FIG. 3A shows the time change of the control command. FIG. 3B shows the time change of the PWM signal A that is outputted to the FET 3A from the drive circuit 6A. FIG. 3C shows the time change of the synchronization signal that is outputted by the synchronization signal output terminal OUTA. In other words, the synchronization signal that is outputted by the synchronization signal output terminal OUTA is equivalent to the synchronization signal inputted into the synchronization signal input terminal INB. FIG. 3D shows the time change of the PWM signal B that is outputted by the drive circuit 6B to the FET 3B. Also, in FIGS. 3A to 3D, each abscissa axis indicates time, and each ordinate axis indicates voltage.

Also, in the present embodiment, PWM carrier wave cycles of the PWM signals A, B that are applied to the FETs 3A, 3B are defined as Tp, which is constant. Also, a cycle of the control command is defined as Tc, which is constant. For example, the cycle Tc is an integral multiple of the cycle Tp in the present embodiment. The control command has a duty ratio, which corresponds to a ratio between an ON (HIGH) duration and the cycle Tc. The duty ratio of the control command is equal to a duty ratio of the PWM signal A, B, which is a ratio between an ON (HIGH) duration and the cycle Tp.

For example, the cycle Tc of the control command may be about 80 times greater than the PWM carrier wave cycle Tp. More specifically, the cycle Tc of the control command is defined as 4 msc, and the PWM carrier wave cycle Tp is defined as 0.05 msc. In the above example case, Tc=80×Tp. It should be noted that in the drawings, the scale relation between the cycle Tc and the PWM carrier wave cycle Tp is not accurately shown in FIG. 3.

An example case, in which the duty ratio of the control command is changed from 12% to 30%, will be described with reference to FIGS. 3A to 3D. Although the time chart before t0 is not shown in FIGS. 3A to 3D, the duty ratio indicated by the control command is 12% before t0. As shown in FIG. 3A, during the time from t0 to t1 or during the period Tc after t0, a signal of the control command that indicates the duty of 30% is inputted into the motor control device 1A. In other words, the duty of 30% means that the ON duration is 30% and the OFF duration is 70% during the Tc.

However, during the time from t0 to t1, the control logic 5A of the motor control device 1A is controlled under the "normal control" shown in Step S6 of FIG. 2. Thus, the control logic 5A outputs the PWM signal A of the duty ratio of 12% to the FET 3A based on the control command (duty ratio of 12%) that was given before t0. Also, the control logic 5A outputs the control command (duty ratio of 12%), which was given before t0, and which serves as the synchronization signal, through the synchronization signal output terminal OUTA.

Also, the control logic 5B outputs the PWM signal B of the duty ratio of 12% to the FET 3B based on the synchronization signal outputted from the synchronization signal output terminal OUTA before t0. In the above, it is assumed that the synchronization signal, which has been outputted through the synchronization signal output terminal OUTA before t0, also has the duty ratio of 12%. In the above case, because the control logic 5B is controlled under the "synchronous drive mode" shown in Step S2 of FIG. 2, the synchronization control is operated such that start of the leading edge of the PWM signal B lags the end of the leading edge of the synchronization signal by the time of 1/2 Tp. In the present embodiment, the leading edge of the PWM signal indicates a positive slope of the waveform of the PWM signal, and thereby the leading edge corresponds to a transitional period (turn-on period) of making the PWM signal from OFF to ON, for example. Also, a trailing edge of the PWM signal indicates a negative slope of the waveform of the PWM signal, and thereby the trailing edge corresponds to another transitional period (turn-off period) of making the PWM signal from ON to OFF, for example.

In contrast, the control logic 5A continuously receives the control command during the time from t0 to t1. Thus, the control logic 5A is capable of recognizing at t1 that the duty ratio of the control command t1 during the time from t0 to t1 is 30%. The control logic 5A has a threshold value (threshold voltage), and when the control command becomes the threshold value, the control logic 5A determines that the control command becomes ON.

Next, the control logic 5A is operated under the "normal control" of Step S6 of FIG. 2 after t1, and then the control logic 5A changes the duty ratio of the PWM signal A into 30%, and also the control logic 5A outputs the control command (duty ratio of 30%), as the synchronization signal, the control command being equivalent to the control command given from the synchronization signal output terminal OUTA during the time from t0 to t1. Also, the control logic 5B outputs the PWM signal B of the duty ratio of 12% to the FET 3B based on the synchronization signal (duty ratio of 12%), which has been given from the synchronization signal output terminal OUTA during the time from t0 to t1. At this time, because the control logic 5B is operated under the "synchronous drive mode" of Step S2 of FIG. 2, the synchronization control is executed such that the start of the leading edge of the PWM signal B (OFF→ON) lags the end of the leading edge of the synchronization signal by the time of 1/2 Tp.

In contrast, the control logic 5A also continuously receives the control command during the time from t1 to t3. Thus, the control logic 5A is capable of recognizing at t3 that the duty ratio of the control command during the time t1 to t3 is 30%. Also, the control logic 5B continuously receives the synchronization signal (duty ratio of 30%) during the time from t1 to t3. Thus, the control logic 5B is capable of recognizing at t3 that the duty ratio of the synchronization signal during the time from t1 to t3 is changed into 30%.

The control logic 5A is operated under the "normal control" of Step S6 of FIG. 2 even after t3. The control logic 5A maintains the duty ratio of the PWM signal A at 30%, and the control logic 5A outputs the control command (duty ratio 30%) during the time from t1 to t3 as the synchronization signal through the synchronization signal output terminal OUTA. Also, the control logic 5B changes the duty ratio of the PWM signal B into 30%, which signal B is to be outputted to the FET 3B, based on the synchronization signal (duty ratio 30%) outputted through the synchronization signal output terminal OUTA during the time from t1 to t3. At this time, because the control logic 5B is operated under the "synchronous drive mode" of Step S2 of FIG. 2, the synchronization control is executed such that the start of the leading edge of the PWM signal B (OFF→ON) lags the end of the leading edge of synchronization signal by the time of 1/2 Tp.

A relation between the PWM signal A and the PWM signal B will be described with reference to FIGS. 4A to 4C. FIGS. 4A to 4C are enlarged views of the time change of the PWM signal A, the synchronization signal, and the PWM signal B after t3 shown in FIGS. 3B to 3D, respectively. As shown in FIGS. 4A to 4C, the leading edge of the synchronization signal, which is outputted from the synchronization signal output terminal OUTA of the motor control device 1A, and which is inputted into the synchronization signal input terminal INB of the motor control device 1B, generally corresponds to the leading edge of the PWM signal A. Also, a transitional time, during which a signal becomes ON from OFF or becomes OFF from ON), of the synchronization signal generally corresponds to a transitional time of the PWM signal A. In the example of FIGS. 4A to 4C, the PWM signal A is turned from OFF to ON during the transitional time from t3 to t4.

Then, the control logic 5B starts outputting the PWM signal B at a time t7, which is different from a time t4 corresponding to the end of the leading edge of the synchronization signal by a phase equivalent to half of the PWM carrier wave cycle (1/2 Tp). Thus, the PWM signal B starts turning from OFF to ON at t7, and the PWM signal B becomes ON at t8. In other words, the start of the leading edge of the PWM signal B corresponds to t7, and the end of the leading edge corresponds to t8. Thus, a leading edge (turn-on) period of the PWM signal A, in which the signal becomes ON from OFF, is different from the turn-on period of the PWM signal B. Also, a trailing edge (turn-off) period of the PWM signal A, in which the signal becomes OFF from ON, is different from the turn-off period of the PWM signal B. The turn-on period and the turn-off period serve as a switching period.

Because the synchronization control for the motor control devices 1A, 1B is executed as above, the leading edge (turn-on) periods of the PWM signals A, B are prevented from overlapping with each other, and also the trailing edge (turn-off) periods of the PWM signals A, B are prevented from overlapping with each other while the switching operation of the FETs 3A, 3B is executed based on the PWM signals A, B.

According to the present embodiment, the motor control device 1 (for example, the motor control device 1A) includes the synchronization signal input terminal IN and the synchronization signal output terminal OUT. The control logic 5 of the motor control device 1 is adapted to receive the synchronization signal from an exterior (for example, the external ECU 100) through the synchronization signal input terminal IN, and is adapted to output the above received synchronization signal to an exterior or to the other motor control device 1 (for example, the motor control device 1B) through the synchronization signal output terminal OUT. The control logic 5 also outputs the PWM signal to the FET 3. The control logic 5 outputs the synchronization signal through the synchronization signal output terminal OUT such that the turned-on period of the PWM signal of the motor control device 1 of interest (for example, the control device 1A) is prevented from overlapping with the turned-on period of the PWM signal of the other motor control device 1 (for example, the control device 1B). Also, the overlap of the turned-off periods between the motor control device 1 of interest and the other motor control device 1 is prevented.

Also, when the motor control device 1 (for example, the control device 1B) receives the synchronization signal through the synchronization signal input terminal IN from the exterior or from the other motor control device 1 (for example, the control device 1A), the motor control device 1 generates the PWM signal outputted to the FET 3 of the motor control device 1 based on the received synchronization signal such that the turned-on period of the PWM signal of the other motor control device 1 (for example, the control device 1A)

that outputs the synchronization signal is prevented from becoming completely identical with the turned-on period of the PWM signal that is outputted to the FET 3 of the motor control device 1 (the control device 1B). Also, the PWM signal generated by the motor control device 1 is set such that the turned-off period of the PWM signal of the other motor control device 1 (the control device 1A) that outputs the synchronization signal is prevented from becoming completely identical with the turned-off period of the PWM signal that is outputted to the FET 3 of the motor control device 1 (the control device 1B).

For example, there may be a case, where three or more motor control devices 1 are provided. One of the two motor control devices 1 (the motor control device 1A in the present embodiment) is operated as the master in the synchronization control, and the other two of the control devices 1 (the motor control device 1B in the present embodiment) are operated as the slaves in the synchronization control. In the above operational case, the master outputs the synchronization signal to the first slave of the slaves (the motor control device 1B) such that the turned-on period of the PWM signal of the first slave is prevented from overlapping the turned-on period of the PWM signal of the master, and such that the turned-off period of the PWM signal of the first slave is prevented from overlapping the turned-off period of the PWM signal of the master. For example, the synchronization signal is identical with the control command of the motor control device 1A in the present embodiment. The synchronization control system may be configured such that the first slave generates the PWM signal B outputted to the FET 3B of the slave based on the synchronization signal, and the first slave also transmits or outputs the synchronization signal, which is similar to the received synchronization signal, to the second slave of the slaves.

In other words, in the present embodiment, the synchronization signal input terminal IN of each slave receives the synchronization signal that is similar to the control command outputted from the synchronization signal output terminal OUT of the master or the slave, which is located upstream of the slave of interest. Also, the synchronization signal, which is similar to the above control command, is outputted through the synchronization signal output terminal OUT of each slave to the synchronization signal input terminal IN of the other slave located downstream of the slave of interest. Note that the synchronization signal may not be outputted through the synchronization signal output terminal OUT of a slave located at the most end (most downstream) of the series of the slaves.

When multiple motor control devices 1 are arranged in parallel with each other in order to PWM control the corresponding motors 16, one of the motor control devices 1 serves as the master. The synchronization signal output terminal OUTs and the synchronization signal input terminal INs of the other motor control devices 1 are daisy-chained, and the master serves as the starting point of the chain. Thus, all the motor control devices 1 are operated under the synchronization control based on the synchronization signal, and thereby the overlap of the turned-on periods and the overlap of the turned-off periods are effectively prevented. As a result, electric current ripple of the power source is limited from increasing. In other words, by combining the motor control devices 1, the electric current ripple is limited from occurring with a more flexible manner compared with the conventional art.

Also, when the control command for controlling the motor 16 of the motor control device 1 of interest is fed as a PWM signal from an exterior (external device), and also when a synchronization signal is not inputted through the synchronization signal input terminal IN, the motor control device 1 of interest serves as the master and is controlled under the "normal control". At this time, the PWM signal, which is outputted to the FET 3 of the motor control device 1, is caused to start rising synchronous with the leading edge (turn-on) of the control command. In other words, the leading edge of the PWM signal coincides with the leading edge of the control command. Also, at the above time, a synchronization signal having a frequency and duty identical with those of the control command is outputted through the synchronization signal output terminal OUT. In the above configuration, one of the multiple motor control devices 1 is selected as the master of the synchronization control, and the master is fed with the control command for controlling a load (motor). Also, the others of the multiple motor control devices 1 serve as the slaves having the synchronization signal output terminal OUTs and the synchronization signal input terminal INs, which are sequentially daisy chained with each other. As a result, all of the motor control devices 1 are operated under the synchronization control based on the control command.

Also, when the synchronization signal is received through the synchronization signal input terminal IN, the control logic 5 generates the PWM signal, which is outputted to the FET 3, by adding a phase difference to the above received synchronization signal such that overlap of the turned-on periods and the turned-off periods are prevented. Also, the control logic 5 is capable of timely outputting the synchronization signal through the synchronization signal output terminal OUT such that the leading edge (trailing edge) of the synchronization signal coincides with the leading edge (trailing edge) of the PWM signal outputted to the FET 3. For example, in FIGS. 4A to 4C, the timing of the leading edge of the synchronization signal is generally similar to the timing of the leading edge of the PWM signal A. The slave of the motor control device 1 of interest receives the above synchronization signal, and the synchronization control of the slave is effectively executed. More specifically, the slave is also capable of generating the PWM signal by adding the phase difference to the above synchronization signal such that the overlap of the turned-on periods and turned-off periods between the slave and another slave that depends on the slave is further prevented.

In the present embodiment, the PWM signal has the carrier wave cycle Tp, and the control logic 5 (synchronization control means) receives the control command for controlling the load (16A, 16B) from the external device 100. Also, the control logic 5 determines the duty ratio (first duty ratio) of PWM signal based on the duty ratio (second duty ratio) of the control command. The control logic 5 outputs the control command as the synchronization signal through the synchronization signal output terminal OUT at a time that is the cycle Tc behind a time of receiving the control command. In the above configuration, the control command serves as the synchronization signal without modification of the control command, and thereby the above advantages are achieved by a simple configuration.

The control IC 2A, which serves as a master in the synchronization control, has the same configuration with the control IC 2B, which serves as a slave in the synchronization control. In general, in a case, where the synchronization control is achieved by the control IC that is dedicated to serve as the master and another control IC that serves as the slave, a product cost of the system becomes high because of the need for designing and manufacturing the two products, the master and the slave. However, because a single control IC is capable of serving as both the master and the slave according to the present embodiment, it is possible to effectively reduce the product cost compared with the conventional case, where both of (a) the control IC dedicated to the master and (b) the other control IC dedicated to the slave need to be employed. Also, in the above conventional case, because the control IC is designed to serve only as the slave, the slave-dedicated control IC is not capable of operating stand-alone (independently) as the master. However, the control IC of the present embodiment is capable of operating stand-alone.

It should be noted that in the present embodiment, as one example, the synchronization control is executed such that the leading edge of the PWM signal B (OFF→ON) lags the leading edge of the synchronization signal by 1/2 Tp. However, in a case, where two motors 16 are employed, the time for lag or delay is not limited to 1/2 Tp, but the delay time may be any one of 1/3 Tp, 1/4 Tp . . . 1/m×Tp, where m indicates a natural number greater than 2. Also, in a case, where three motors 16 are employed, the delay time may be any one of 1/3 Tp, 1/4 Tp . . . 1/m×Tp, where m is a natural number equal to or greater than 3. Also, in a case, where n number of motors 16 are employed (n indicating a natural number equal to or greater than 2), the delay time may be set as 1/(n+m)×Tp (m=0, 1, 2 . . . ).

Specifically, when two motors 16 are employed, the delay time may be set as any one of 1/2 Tp, 1/3 Tp, 1/4 Tp, 1/5 Tp . . . , and when three motors 16 are employed, the delay time may be set as any one of 1/3 Tp, 1/4 Tp, 1/5 Tp, . . . , and when four motors 16 are employed, the delay time may be set as any one of 1/4 Tp, 1/5 Tp, . . . . In the above example cases, the above advantages of the present embodiment will be achieved.

The operation of the motor control devices 1A, 1B will be described with reference to FIG. 5. More specifically, FIG. 5 shows the operational condition of the motor control devices 1A, 1B, which depends on a connection state between the synchronization signal output terminal OUTA and the synchronization signal input terminal INB, and which also depends on a connection state of the control command input terminals SIA, SIB. In a column labeled as "synchronous connection" of FIG. 5, "O" indicates that the synchronization signal output terminal OUTA is connected with the synchronization signal input terminal INB, and "-" indicates that the synchronization signal output terminal OUTA is not connected with the synchronization signal input terminal INB.

Also, in a column labeled as "SI input" in FIG. 5, "O" indicates that the control command is received through the control command input terminal SIA (SIB), and "-" indicates that the control command is not received through the control command input terminal SIA (SIB). In a column labeled as "output" in FIG. 5, "normal control" indicates that the motor 16A (16B) is operated based on the control command inputted into the control command input terminal SIA (SIB), and "synchronization control" indicates that the motor control device 1A is operated under the "normal control" and the motor control device 1B is operated under the synchronous drive mode.

In the above, in an example case of item numbers (2), (3), (7), a single motor control device 1 drives one motor 16, which is connected to the motor control device 1, under the normal control. In another operational case of item number (4), the motor control devices 1A, 1B drives the corresponding motors 16A, 16B by outputting the PWM signals A, B at time identical with each other. In another operational case of item number (6), the motor control device 1A is operated under the "normal control", and the motor control device 1B is operated under the synchronous drive mode. In other words, the above operational case of item number (6) corresponds to an operation shown in FIG. 4.

In another operational case of item number (8), both the control command input terminals SIA, SIB receive the control commands, and also at the same time the synchronization signal output terminal OUTA is connected with the synchronization signal input terminal INB. In order to effectively realize the above operational condition, the control logic (the control logic 5B in FIG. 1, for example) may be designed to ignore the received control command when the synchronization signal input terminal IN is in connection and simultaneously the control command input terminal SI receives the control command. Also, in the above case, the control logic may be designed to output the PWM signal based on the synchronization signal inputted through the synchronization signal input terminal IN. Thus, in the above case, for example, the control logic 5B is operated as the slave based on the synchronization signal fed from the control logic 5A serving as the master.

(First Modification of First Embodiment)

In the above first embodiment, the control logic 5B operates such that the start of the leading edge of the PWM signal B is displaced from the "end" of the leading edge of the synchronization signal by a phase equivalent to half of the PWM carrier wave cycle (=Tp÷2). In the present modification, the control logic 5B may alternatively operate such that the start of the leading edge of the PWM signal B is displaced from the "start" of the leading edge of the synchronization signal by the phase equivalent to half of the PWM carrier wave cycle (=Tp±2).

Figure 6:
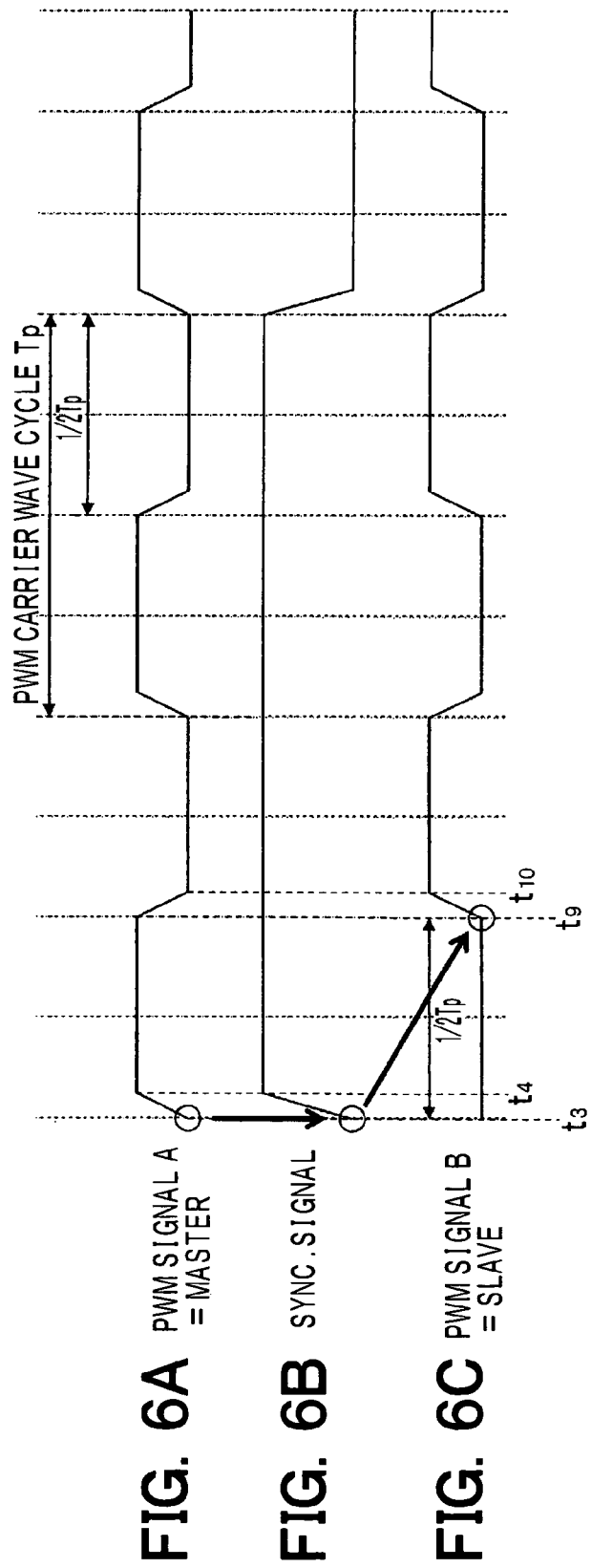
FIGS. 6A to 6C are diagrams each illustrating a PWM signal waveform when the two control devices are operated under a synchronization control based on the control command of the motor when the duty ratio is 50% according to the first modification of the first embodiment.
Figure 7:
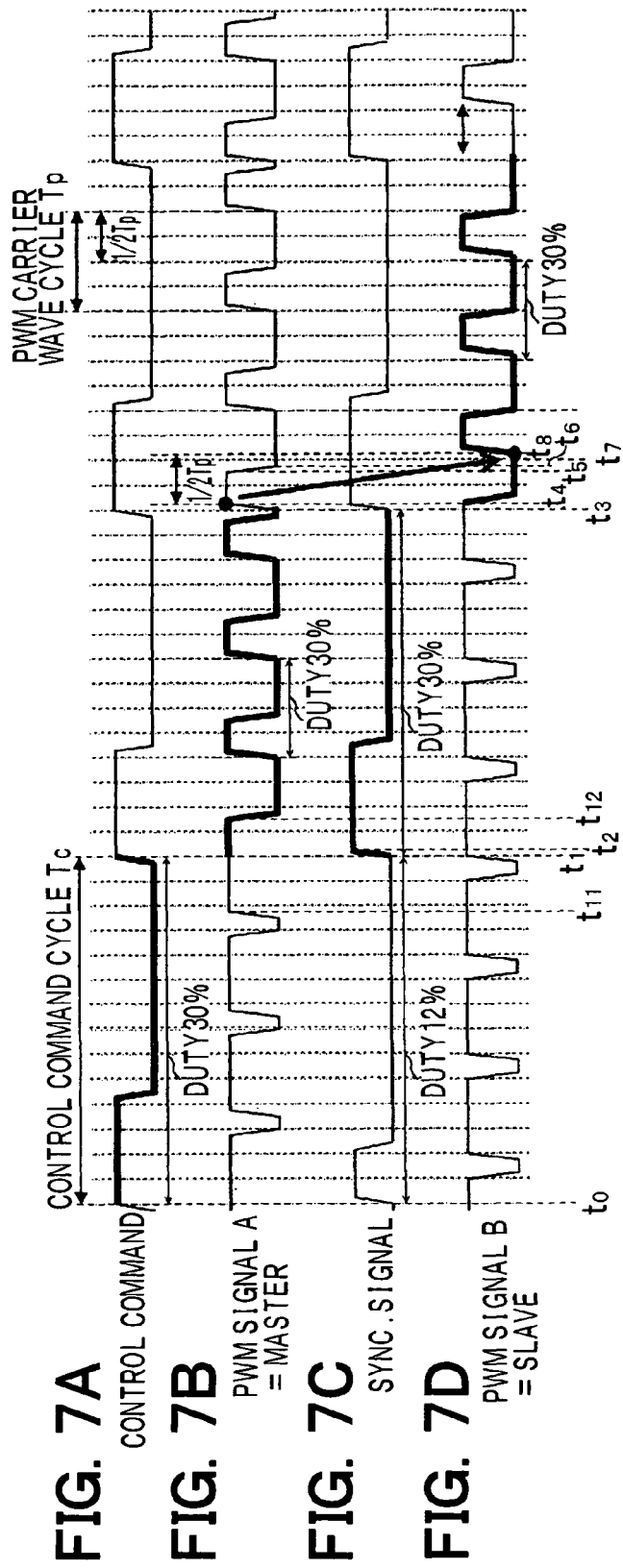
FIGS. 7A to 7D are diagrams each illustrating a PWM signal waveform when two control devices are operated under the synchronization control based on the control command of the motor according to the second modification of the first embodiment.

More specifically, the modification will be described with reference to FIGS. 6A to 6C that are diagrams each illustrating a PWM signal waveform when two control devices are operated under the synchronization control based on the control command of the motor. FIGS. 6A to 6C are different from FIGS. 4A to 4C in the following two points (1), (2). (1) The duty ratio of the PWM signal A is 50% in FIGS. 6A to 6C although the duty ratio of the PWM signal A is 30% in FIGS. 4A to 4C. (2) The start of the leading edge of the PWM signal B is determined based on the "start" of the leading edge of the synchronization signal in FIGS. 6A to. 6C although the start of the leading edge of the PWM signal B is determined based on the "end" of the leading edge of the synchronization signal in FIGS. 4A to 4C.

In FIGS. 6A to 6C, when the control logic 5B recognizes at t3 the start of the leading edge of the synchronization signal, the control logic 5B prepares for starting the output of the PWM signal B after a period of 1/2 Tp since t3. More specifically, the control logic 5B generates a PWM signal, which is to start rising at t3 from OFF to ON, and which has the duty ratio of 50%, and then the control logic 5B shifts the phase of the generated PWM signal by an amount equivalent to 1/2 Tp. In other words, the PWM signal A continues the ON duration for a period of 1/2 Tp, which is the duty ratio of 50%, and more accurately, the ON duration includes the transitional period, where the leading edge or the trailing edge of the signal exist as shown in FIG. 6A. In the above operation, the PWM signal B is in an opposite phase with the PWM signal A. In other words, during the period t9 to t10, the trailing edge of the PWM signal A coincides with the leading edge of the PWM signal B such that it is possible to cancel the generation of the ripple. Also, after t10, the leading edge of the PWM signal A coincides with the trailing edge of the PWM signal B such that it is also possible to cancel the generation of the ripple.

As above, in a case, where the control logic 5B serving as the slave is adapted to give the PWM signal B such that the start of the leading edge of the PWM signal B is displaced from the "start" of the leading edge of the synchronization signal by the phase equivalent to half of the PWM carrier wave cycle (=Tp÷2), it is possible to prevent the generation of ripple if the duty ratio is set as 50%. Also, when the duty ratio is set as a value other than 50%, the advantages similar to those in the first embodiment are achievable in the present modification.

(Second Modification of First Embodiment)

The above first embodiment is explained with an example case, where the cycle Tc of control command is equal to an "integral multiple" of the PWM carrier wave cycle Tp. In the present modification, another example case, where the cycle Tc is not equal to the integral multiple of the cycle Tp. FIGS. 7A to 7D are timing charts each illustrating a PWM signal waveform when two control devices are operated under the synchronization control based on the control command of the motor. As shown in FIGS. 7A to 7D, in the present modification, Tc=Tp×(n+0.5), where n is a natural number equal to or greater than 2. Thus, at time t1, where one cycle of the control command has been ended, the cycle of the PWM signal A has not ended. In other words, the end of the one cycle of the control command does not coincide with the end of one cycle of the PWM signal A.

In the above case, the control logic 5A is capable of recognizing at t1 that the control command has become ON from OFF (OFF→ON). Then, the control logic 5A computes the duty ratio of the control command that has been inputted during a period from t0 to t1, and starts, at t1, outputting the PWM signal A, which is based on the computed duty ratio, and which has a new duty ratio of 30%. When it is detected at t1 that the PWM signal A has already been ON (for example, during a period from t1 to t2 in FIG. 7B), the PWM signal A is kept ON. Also, the control logic 5A starts, at t1, outputting the control command, which has been received during the period from t0 to t1, as the synchronization signal through the synchronization signal output terminal OUTA. In other words, the control logic 5A starts outputting the synchronization signal at t1 through the synchronization signal output terminal OUTA, and in the above, the synchronization signal is equivalent to the control command.

The control logic 5B receives the above synchronization signal through the synchronization signal input terminal INB, and the control logic 5B is capable of recognizing at t4 that the synchronization signal has become ON from OFF (OFF→ON). Then, the control logic 5B computes the duty ratio of the control command that has been inputted thereinto during a period from t2 to t4, and starts outputting at t8 the PWM signal B, which is based on the computed duty ratio, and which has a new duty ratio of 30%. Note that t8 is 1/2 Tp behind t4. It should be noted that in an example operation case of the control logic 5B, when the PWM signal B has already been ON (for example, during a period from t3 to t4 in FIG. 7) at a change time, where a cycle of the synchronization signal has been changed, the PWM signal B is forcibly turned OFF. In contrast, if the PWM signal B is OFF at the above change time, the PWM signal B is maintained at the OFF state. In other words, when the end of the leading edge of the synchronization signal coincides with the ON state of the PWM signal B, the PWM signal B is forcibly turned OFF. Otherwise, the PWM signal B remains OFF.

As a result of the above operation, as shown in FIGS. 7B and 7D, the leading edge of the PWM signal A is limited from coinciding with the leading edge of the PWM signal B after t3. Also, the trailing edge of the PWM signal A is limited from coinciding with the trailing edge of the PWM signal B after t3. Thus, advantages similar to those in the first embodiment are achievable in the present modification.

It should be noted that at a time (for example, at t1), when the cycle Tc of control command is changed, the ON duration of the PWM signal A, or B may temporarily become different from an estimated duration that is determined based on the duty ratio of the inputted command. For example, the ON duration of the PWM signal A during a period from t11 to t12 is different from the estimated ON duration. However, even in the above case, if Tc is made substantially longer than Tp, in other words, if a frequency of the control command or of the synchronization signal is made substantially shorter than a frequency of the PWM signal, the duty ratio of the PWM signal during Tc is made approximately equal to the duty ratio of the control command.

(Second Embodiment)

Figure 8:
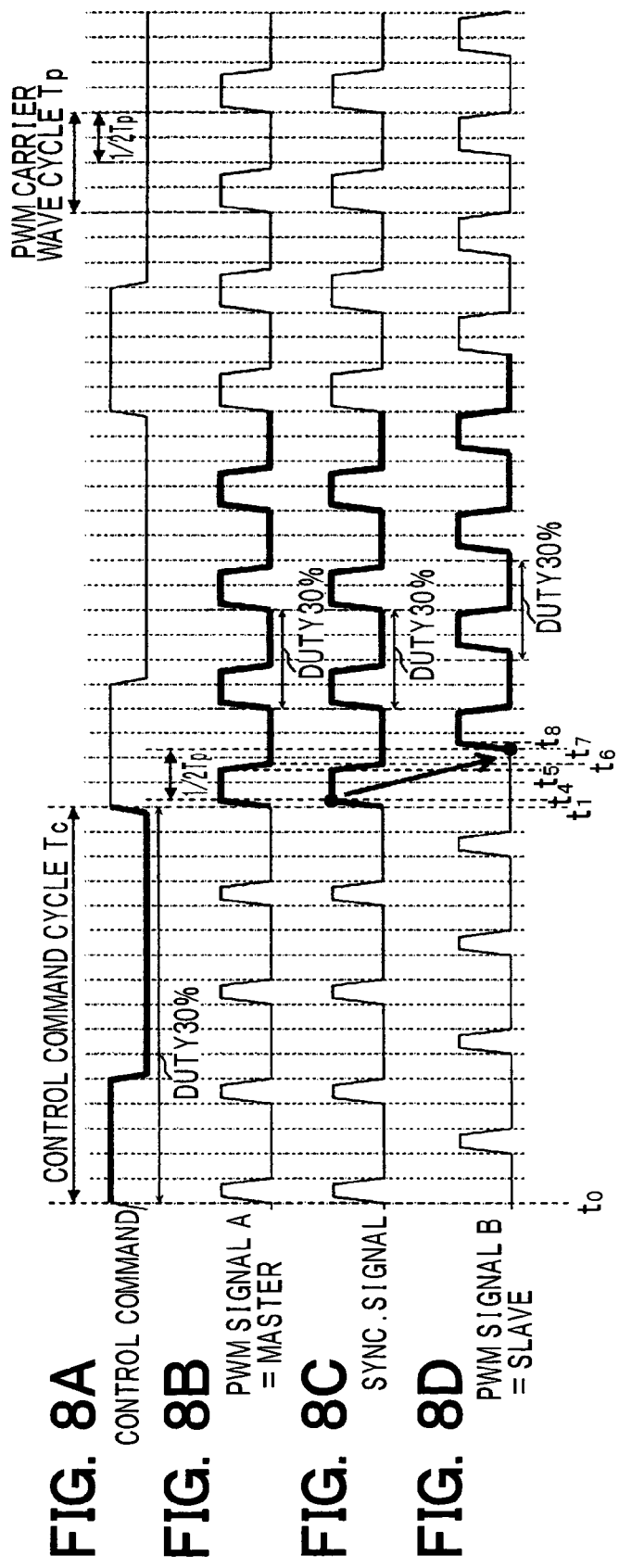
FIGS. 8A to 8D are diagrams each illustrating a PWM signal waveform when two control devices are operated under the synchronization control based on the control command of the motor according to the second embodiment of the present invention.

FIG. 8 shows the second embodiment of the present invention. Similar components of the device of the present embodiment, which are similar to the components of the device of the first embodiment, will be indicated by the same numerals, and the explanation thereof will be omitted. Thus, parts of the device different from the device of the first embodiment will be mainly described. FIGS. 8A to 8D are diagrams illustrating waveforms of the signals of two control devices during the synchronization control based on the control command given to the motor according to the present embodiment. In the second embodiment, the motor control device 1A uses the control command received through the control command input terminal SIA in order to generate the PWM signal A similar to the first embodiment. Then, the motor control device 1A outputs the synchronization signal, which is identical to the PWM signal A generated by the control IC 2A of the motor control device 1A and outputted to the FET 3A of the control device 1A, through the synchronization signal output terminal OUTA (FIGS. 8B and 8C). In other words, the motor control device 1A outputs the PWM signal A as the synchronization signal to the motor control device 1B through the synchronization signal output terminal OUTA, for example.

In contrast, when the motor control device 1B receives the PWM signal A of the motor control device 1A through the synchronization signal input terminal INB, the motor control device 1B outputs the PWM signal B, which is made by adding a certain phase difference to the PWM signal A as shown in FIG. 8D. In other words, the motor control device 1B outputs the PWM signal B that lags the leading edge of the PWM signal A by the phase difference equivalent to half of the PWM carrier wave cycle Tp. More specifically, the motor control device 1B outputs the PWM signal B such that the start of the leading edge of the PWM signal B lags the end of the leading edge of the PWM signal A by the phase difference equivalent to half of the PWM carrier wave cycle Tp. The above operation corresponds to "synchronous drive mode" in step S2. Then, the motor control device 1B is configured to output a signal identical to the PWM signal B, which is to be outputted to the FET 3B of the motor control device 1B, through the synchronization signal output terminal OUTB. In other words, the PWM signal. B also through the synchronization signal output terminal OUTB.

The above operation will be detailed with reference to FIGS. 8A to 8D. The control logic 5A of the motor control device 1A is capable of recognizing at t1 the duty ratio of the control command. The above time t1 coincides with the end of the leading edge of the control command. In other words, the control command has become completely ON at t1. Then, the control logic 5A starts increasing the PWM signal A at t1 such that the control logic 5A outputs the PWM signal A that has a duty ratio equivalent to the duty ratio of the control command during the period from t0 to t1. At the same time, the control logic 5A starts outputting, at t1, the synchronization signal, which is identical with the PWM signal A that is started outputted at t1, through the synchronization signal output terminal OUTA.

In contrast, the control logic 5B is capable of recognizing at t4 that the synchronization signal (=the PWM signal A) has become completely ON. In other words, the control logic 5B is capable of recognizing at t4 the end of the leading edge of the synchronization signal. Then, the control logic 5B computes the duty ratio of the synchronization signal that is inputted during a period from t4 to t6. Then, the control logic 5B starts outputting the PWM signal B, which is based on the computed duty ratio, and which has a new duty ratio of 30%, at t7 that is 1/2 Tp behind t4.

According to the second embodiment, the control logic 5 employs a signal, which is equivalent to a PWM signal outputted to the FET 3 of the control logic 5, as the synchronization signal outputted through the synchronization signal output terminal OUT.

As a result, one motor control device 1 is capable of executing the synchronization control based on the synchronization signal such that a turned-on period of the PWM signal outputted to the FET 3 of the one motor control device 1 is prevented from overlapping with a turned-on period of the PWM signal of the other motor control device 1 that outputs the synchronization signal to the one motor control device 1. Also, a turned-off period of the PWM signal outputted to the FET 3 of the one motor control device 1 is prevented from overlapping with a turned-off period of the PWM signal of the other motor control device 1. In the present embodiment, an example case of one slave is explained. However, multiple slaves, such as a first slave, a second slave, may be provided to the master.

(Third Embodiment)

Figure 9:
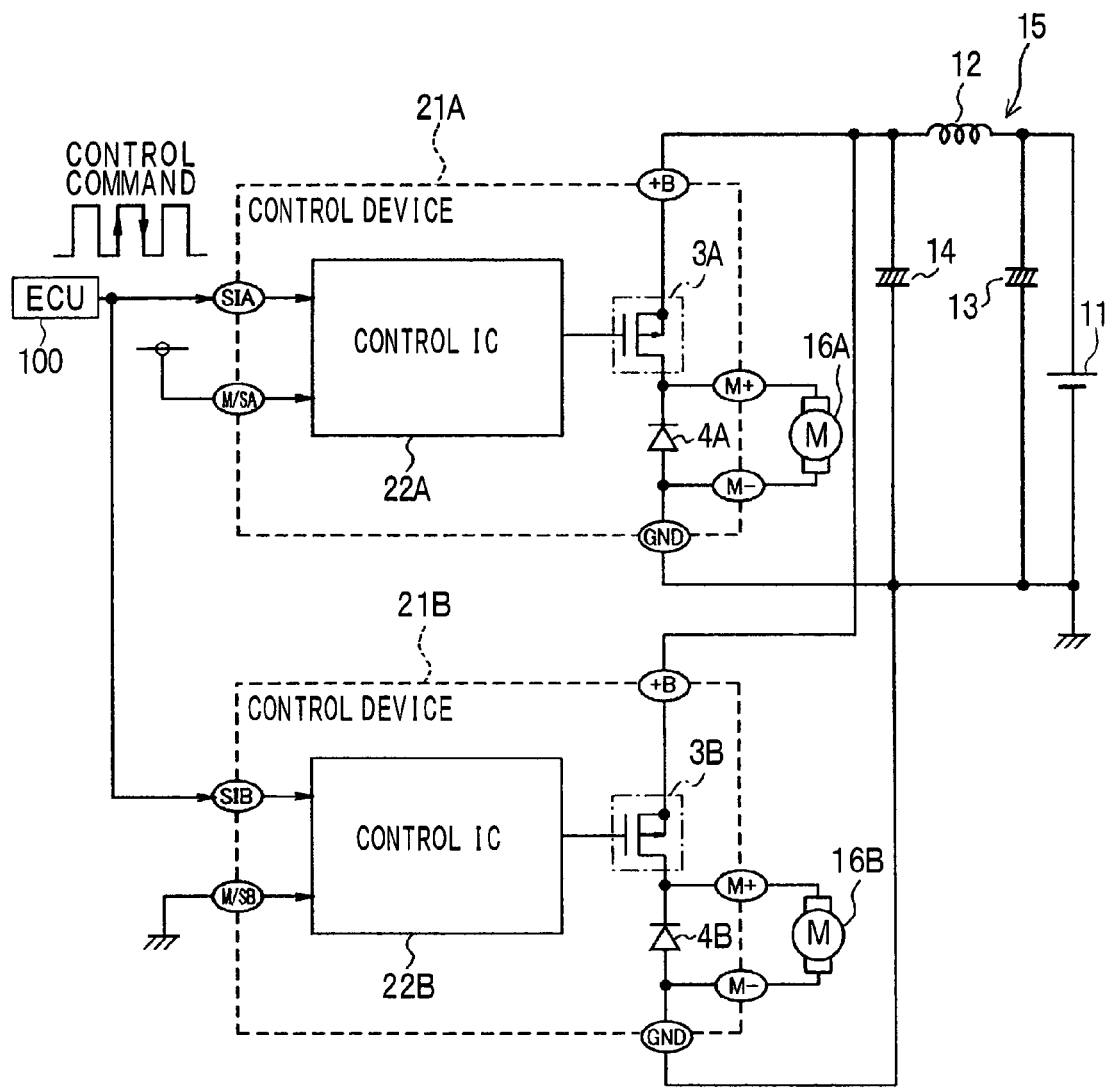
FIG. 9 is a diagram illustrating a control system having two motor control devices according to the third embodiment of the present invention.

FIG. 9 to FIG. 11 illustrate the third embodiment of the present invention, and parts different from the first embodiment will be described mainly. Control ICs 22A, 22B of the third embodiment are similar to the controls IC2 of the first embodiment in that the control ICs 22A, 22B include various protectors and detectors, such as the control logics 5A, 5B, the drive circuits 6A, 6B, the over-voltage protectors 7A, 7B, the over-current detectors 8A, 8B, the short-circuit detectors 9A, 9B, the temperature protectors 10A, 10B, respectively.

The control IC 22 (the synchronization control means, phase shifting means) is connected with the control command input terminal SI and synchronization setting terminal M/S. The control IC 22 receives the control command through the control command input terminal Si and receives a setting signal through the synchronization setting terminal M/S. When the setting signal inputted into the synchronization setting terminal M/S is set at a high level, the control IC 22 is set to serve as a master, and when the setting signal is set at a low level, the control IC 22 is set to serve as a slave of the master.

In other words, in the third embodiment, the control IC 22 has programs such that when the setting signal of high level is inputted into the synchronization setting terminal M/S, the control IC 22 is operated under the normal control. Also, when the setting signal of low level is inputted into the synchronization setting terminal M/S, the control IC 22 is operated under the synchronous drive mode based on the program. In the present embodiment, in the synchronous drive mode, the synchronization control is executed such that the PWM signal, which is applied to the motor 16 connected to the control IC 22, starts rising at a time 1/2 Tp behind the leading edge of control command inputted through the control command input terminal SI.

In FIG. 9, the control IC 22A is connected with the synchronization setting terminal M/SA, which is connected with a terminal +B, such that the setting signal of high level is inputted to the control IC 22A through the synchronization setting terminal M/SA. Thus, the control IC 22A is operated as the master. The control IC 22B is connected with the synchronization setting terminal M/SB, which is grounded, such that the setting signal of low level is inputted to the control IC 22B through the synchronization setting terminal M/SB.

Also, although not shown, a pull-up resistor is provided between the synchronization setting terminal M/SA (M/SB) and the control IC 22A (22B), and the pull-up resistor is similar to the pull-up resistor 17 that is provided between the synchronization signal input terminal IN and the control IC5 in the first embodiment. As above, two pull-up resistors are provided respectively to the control IC 22A, 22B in the present embodiment. Thus, the control IC 22A, 22B is capable of determining whether the synchronization setting terminal M/SA is connected to the terminal +B or of determining whether the synchronization setting terminal M/SB is connected to a GND terminal based on the setting signal received through the synchronization setting terminal M/SA, M/SB, respectively. In a case, where the control IC 22A (22B) determines that the synchronization setting terminal M/SA (M/SB) is not connected, the control IC 22A (22B) operates in the same manner as the control IC 22A (22B) does when the setting signal of high level is inputted thereto.

As a result, the control IC 22B is operated as the slave. Also, the control commands are inputted to both the control command input terminal SIA, which is connected to the control IC 22A, and the control command input terminal SIB, which is connected to the control IC 22B.

The operation of the above configuration of the present embodiment will be described with reference to FIG. 10. Each of the control ICs 22A, 22B serves as synchronization control means and phase shifting means. As shown in FIG. 10, each of the control ICs 22A, 22B is capable of recognizing at t1 that the duty ratio of the control command, which has been inputted to the control command input terminals SIA, SIB from the external ECU 100 during a period from t0 to t1, is 30%. The external ECU 100 serves as synchronization means. As shown in FIG. 9, both the control ICs 22A, 22B receive the common synchronization signal from the external ECU 100. At this time, the control IC 22A is operated as the master because the control IC 22A receives the setting signal of high level through the synchronization setting terminal M/SA, and thereby the control IC 22A starts increasing a level of the PWM signal A at t1. As a result, the start of the leading edge of the PWM signal A generally coincides with time t1.

In contrast, the control IC 22B is operated as the slave because the control IC 22B receives the setting signal of low level through the synchronization setting terminal M/SB, and thereby the control IC 22B starts increasing a level of the PWM signal B at t2 that is 1/2 Tp behind t1. In other words, timing of outputting a carrier wave of the PWM signal B is synchronized with timing t1. Therefore, the phase of the PWM signal B is shifted by an amount equivalent to 1/2 Tp, and thereby the leading edge of the PWM signal A is prevented from overlapping with the leading edge of the PWM signal B, and also the trailing edge of the PWM signal A is prevented from overlapping with the trailing edge of the PWM signal B. As a result, advantages similar to those in the first embodiment are achievable in the present embodiment.

It should be noted that in the third embodiment, as shown in FIG. 11, the motor control devices 21A, 21B are operated in various manners based on the combination of the setting signal and the control command that are inputted to the motor control devices 21A, 21B. "H" in FIG. 11 indicates that the high level setting signal is received through the synchronization setting terminal M/S. Also, "L" in FIG. 11 indicates that the low level setting signal is received through the synchronization setting terminal M/S. "O" indicates that the control command is received through the control command input terminal SI, and the control command may have the duty of 0%. In the operation conditions identified by item numbers (8) and (12) in FIG. 11, one of the motor control devices is operated as the master, and the other one of the motor control devices is operated as the slave such that the overlap of the leading edges of the PWM signals of the motor control devices is prevented or the overlap of the trailing edge of the PWM signals is prevented.

Also, in the operations identified by item numbers (2), (3), (6), (7), (10), (11), (14), (15), only one of the motor control devices is operated under the normal control. It should be noted that in the operations identified item numbers (4), (16), the leading edges of the PWM signals may be overlapped with each other or the trailing edge of the PWM signals may be overlapped with each other. Thus, when the above operations are selected, a microcomputer (not shown) may be additionally provided for storing error codes. Also, a countermeasure may be needed in order to prevent the input of the high level signal into multiple synchronization setting terminals M/S.

An additional motor control device (not shown) may be provided as a slave in addition to the motor control device 21B that serves as the slave. Then, the additional motor control device receives through the synchronization setting terminal M/S a signal having an electric potential different from that of the setting signal inputted into the synchronization setting terminal M/SB of the motor control device 21B. For example, the signal to the additional motor control device may have a potential higher than the setting signal to the motor control device 21B by 5 V. Based on the above signal, the start of the leading edge of the PWM signal of the additional motor control device lags the PWM signal B of the motor control device 21B by 1/2 Tp. As above, a phase shift amount (1/2 Tp) given to the PWM signal may be changed based on the type of the slave, which is determined by the control IC 22 based on the setting signal inputted to the synchronization setting terminal.

As above, the control IC 22 determines a kind of slave of the motor control device (what kind of slave the motor control device serves as) based on the setting signal received through the synchronization setting terminal M/S, and the control IC 22 changes the phase shift amount, which is added to the PWM signal, based on the kind of the slave determined by the control IC 22. As a result, even when there are two or more load drive devices serve as the slaves, different phase shift amounts are added to the carrier waves of the different PWM signals of the load drive devices. Thus, it is possible to prevent the overlap of the switching periods between the PWM signals of the load drive devices advantageously.

(Fourth Embodiment)

Figure 12:
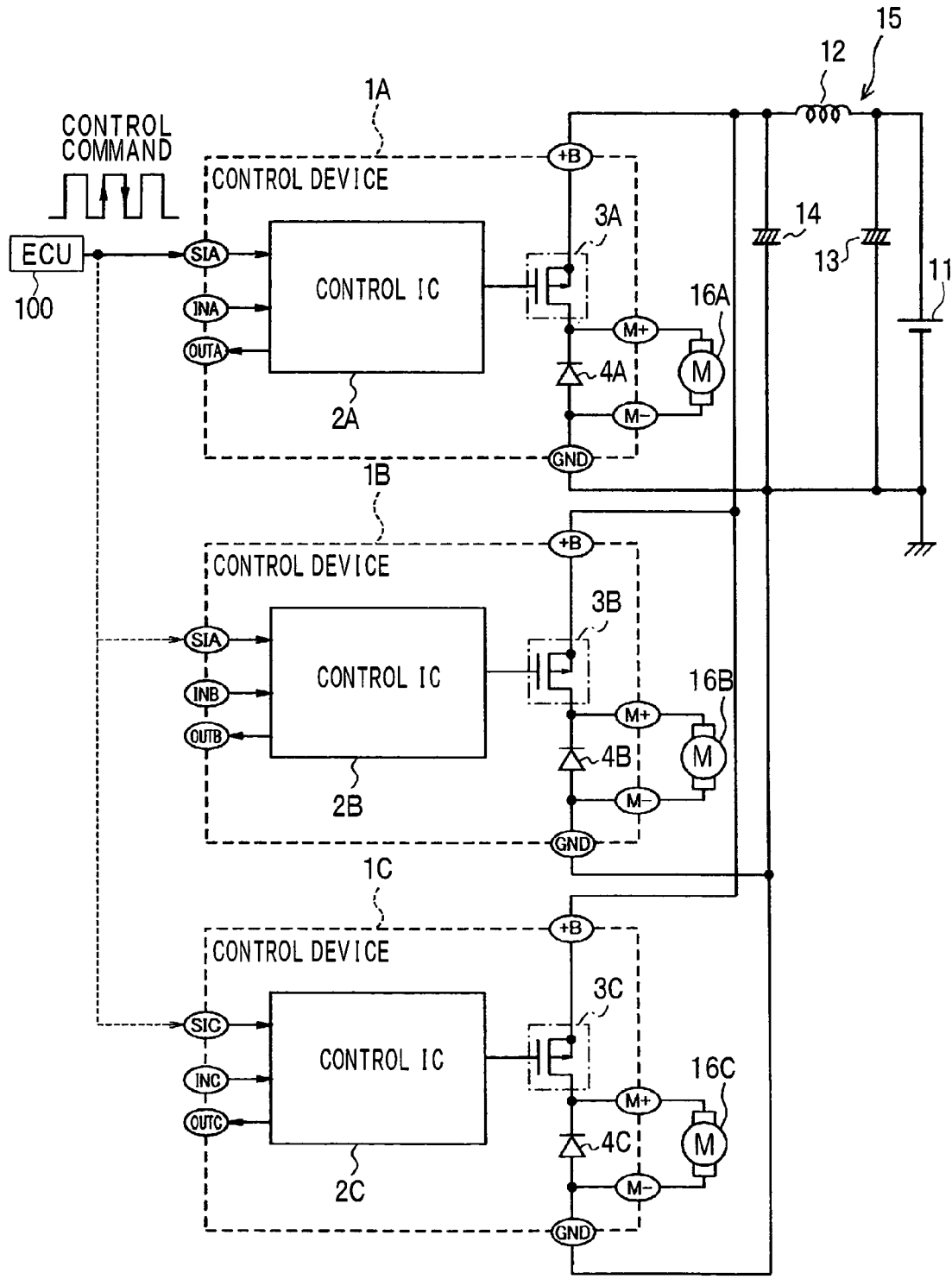
FIG. 12 is a diagram illustrating a control system having two motor control devices according to the fourth embodiment of the present invention.

FIG. 12 to FIG. 14 illustrate the fourth embodiment of the present invention. The fourth embodiment illustrates a configuration having three motor control devices 1 for executing the synchronization control, and the configuration of the present embodiment is similar to that of the first embodiment or the second embodiment. For example, the motor control devices 1B, 1C serve as the slaves in the present embodiment. FIGS. 13A to 13E are timing charts each illustrating a waveform of the signal. As shown in FIGS. 13A to 13E, similar to the first embodiment, the PWM signal outputted synchronously with the end of the leading edge of the control command (input signal), and each of the motor control devices 1B, 1C adds the phase difference for preventing the overlap of the turned-on periods and the overlap of the turned-off periods.

In the configuration of FIG. 12, the motor control device 1A serving as the master outputs a synchronization signal AB through the synchronization signal output terminal OUTA. The synchronization signal AB is equivalent to the control command, which is received through the control command input terminal SIA. The motor control device 1B serving as the slave has the synchronization signal input terminal INB that is connected with the synchronization signal output terminal OUTA. The motor control device 1B directly outputs a synchronization signal BC through the synchronization signal output terminal OUTB. The synchronization signal BC is equivalent to the synchronization signal AB (equivalent to the control command), which is received through the synchronization signal input terminal INB.

As above, each motor control device 1 outputs through the synchronization signal output terminal OUT the synchronization signal that is received through the synchronization signal input terminal IN. Thereby, the present embodiment is different from each of the above embodiments in that there is no time lag generated between timing of receiving the synchronization signal and timing of outputting the synchronization signal. Also, as shown in FIG. 13C, the control logic 5B of the motor control device 1B (not shown in FIG. 12) starts outputting the PWM signal B at t23 that is 1/3 Tp behind t21, which coincides with the end of the leading edge of the synchronization signal.

Also, the motor control device 1C serving as the slave has the synchronization signal output terminal OUTB that is connected with the synchronization signal input terminal INC. The motor control device 1C outputs through the synchronization signal output terminal OUTC the synchronization signal (equivalent to the control command), which is received through the synchronization signal input terminal INC. Also, as shown in FIG. 13E, the control logic 5C of the motor control device 1C starts outputting a PWM signal C at t25 that is 2/3 Tp behind t21, which coincides with the end of the leading edge of the synchronization signal.

Advantages of the present embodiment will be described below. The PWM signal A rises during a period from t20 to t21. However, the PWM signal B and the PWM signal C have not started rising during the period. Thus, only the PWM signal A contributes to the generation of ripple at most if any. Also, the PWM signal A falls during a period from t22 to t23 as shown in FIG. 13. However, the PWM signal B and the PWM signal C do not fall during the period. Thus, only the PWM signal A contributes the generation of ripple at most if any. The PWM signal B rises during a period from t23 to 24, however the PWM signal A and the PWM signal C do not rise during the period. As a result, only the PWM signal B contributes the generation of ripple at most if any.

Also, the PWM signal B falls during a period from t25 to 26. The PWM signal A does not fall during the period, but the PWM signal C rises during the period. As a result, the generation of ripple due to the PWM signal B is cancelled by the PWM signal C. Also, the PWM signal C falls during a period from t28 to 29, however the PWM signal A and the PWM signal B do not fall during the period. Thus, only the PWM signal C contributes the generation of ripple at most if any. Also, the PWM signal A rises during a period from t27 to 28, during which the next cycle of the PWM carrier wave cycle Tp begins. In the above case, the PWM signal B and the PWM signal C do not rise, and thereby only the PWM signal A contributes the generation of ripple at most if any. As above, even when multiple motor control devices 1 are connected, advantages similar to those in the first embodiment are achievable in the present embodiment.

(First Modification of Fourth Embodiment)

The first modification of the fourth embodiment will be described with reference to FIGS. 14A to 14C. Each of the motor control devices 1 is given a common control command, which is shared by the motor control devices 1, through the control command input terminal SI as shown by a dashed line in FIG. 12. The control logic 5 of each motor control device 1 generates a PWM signal based on the common control command. Then, each motor control device 1 outputs the generated PWM signal through the synchronization signal output terminal OUT. Then, when the motor control devices 1B, 1C serving as the slaves receive through the synchronization signal input terminals INB, INC the PWM signal from the motor control devices 1A, 1B located upstream thereof, respectively, the motor control devices 1B, 1C generate a PWM signal by adding a phase difference based on the leading edge of the received PWM signal such that the overlap of the turned-on periods and overlap of the turned-off periods are prevented.

More specifically, when the motor control device 1B serving as the slave receives the PWM signal from the motor control device 1A through the synchronization signal input terminal INB, the motor control device 1B generates a PWM signal by adding a phase difference (1/3 Tp) to the end of the leading edge of the received PWM signal from the motor control device 1A such that the generated PWM signal lags the end of the leading edge of the received PWM signal by 1/3 Tp. Also, when the motor control device 1C serving as the slave receives the PWM signal from the motor control device 1B through the synchronization signal input terminal INC, the motor control device 1C generates a PWM signal by adding a phase difference (1/3 Tp) to the end of the leading edge of the received PWM signal from the motor control device 1B such that the generated PWM signal lags the end of the leading edge of the received PWM signal by 1/3 Tp.

In the present modification, all of the duty ratios of the PWM signals A, B, C are determined based on the common control command. Timing of rising the PWM signal B depends on the synchronization signal that is equivalent to the PWM signal A. Timing of rising the PWM signal C depends on the synchronization signal that is equivalent to the PWM signal B. In FIG. 14, the PWM signal B starts rising at t33 that is 1/3 Tp behind t31, with which the end of the leading edge of the PWM signal A coincides. Also, the PWM signal C starts rising at t36 that is 1/3 Tp behind t34, with which the end of the leading edge of the PWM signal B coincides.

In the present modification, simultaneous rise of multiple PWM signals that rise simultaneously with each other is effectively prevented. Also, simultaneous fall of multiple PWM signals that fall simultaneously with each other is also effectively prevented. As a result, advantages similar to those in the fourth embodiment are achievable in the present modification.

(Second Modification of Fourth Embodiment)

Figures 15A, 15B, 15C:
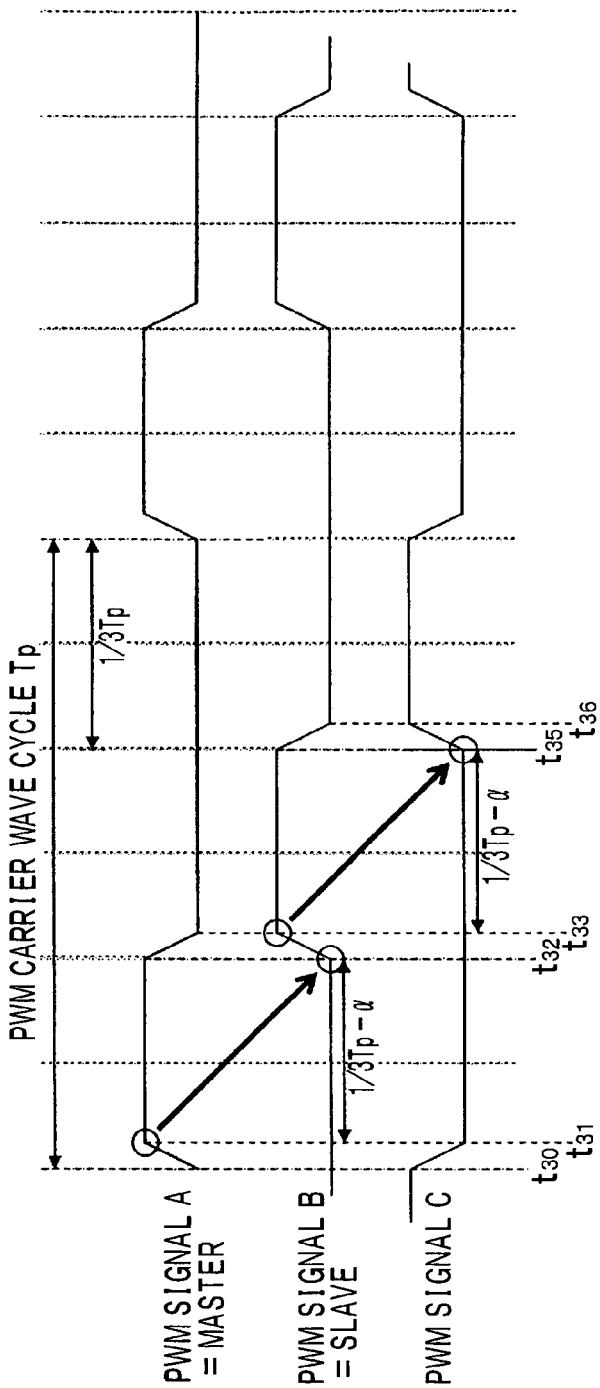
FIGS. 15A to 15C are diagram each illustrating a PWM signal waveform when the three control devices are operated under the synchronization control based on the control command of the motor according to the second modification of the fourth embodiment.

The second modification of the fourth embodiment will be described with reference to FIGS. 15A to 15C. The second modification is further modification of the first modification of the fourth embodiment. In the first modification, a downstream PWM signal starts rising at a time that is 1/3 Tp behind a time, with which the end of the leading edge of upstream PWM signal coincides. However, in the second modification, a downstream PWM signal starts rising at a time that is behind a time, to which the end of the leading edge of the upstream PWM signal coincides, by a delay time of 1/3 Tp−α.

In the above, α indicates a transitional time, during which the PWM signal becomes ON from OFF or becomes OFF from ON. In other words, α indicates a period (turn-on period) measured from the start to the end of the leading edge of the PWM signal, or indicates a period (turn-off period) measured from the start to the end of the trailing edge of the PWM signal. In the second modification of the fourth embodiment, the PWM signal starts rising at a time that lags the end of the leading edge of the synchronization signal (equivalent to the upstream PWM signal) by a certain period, which is computed by subtracting α from 1/3 Tp.

All of the duty ratios of the PWM signals A, B, C are determined based on the common control command. Timing of rising the PWM signal B is determined based on the synchronization signal that is equivalent to the PWM signal A, and timing of rising PWM signal C is determined based on the synchronization signal that is equivalent to the PWM signal B. In an example case of FIGS. 15A to 15C, the PWM signal B starts rising at t32 that lags t31, which coincides with the end of the leading edge of the PWM signal A, by 1/3 Tp−α. Because the PWM signal A also starts falling at t32, at which the PWM signal B starts rising as above, the generation of ripple is cancelled. Also, the PWM signal C starts rising at t35 that lags t33, which coincides with the end of the leading edge of the PWM signal B, by 1/3 Tp−α. Because the PWM signal B also starts falling at t35, at which the PWM signal C starts rising as above, the generation of ripple is cancelled.

According to the second modification, advantages obtained in the first modification of the fourth embodiment are also obtained. In addition to the above advantages, the generation of ripple is effectively limited because the leading edge of one PWM signal coincides with the trailing edge of the other PWM signal.

(Fifth Embodiment)

FIGS. 16, 17A, 17B, 18A to 18C illustrate the fifth embodiment of the present invention, and parts different from the first embodiment will be mainly described. In the fifth embodiment, the synchronization control of two motor control devices 31A, 31B (first load drive device, second load drive device) is executed. The motor control devices 31A, 31B have respective control ICs 32A, 32B (the synchronization control means) that are not provided with the synchronization signal input terminal IN or the synchronization signal output terminal OUT. Each motor control device 31A, 31B has the control command input terminal SIA, SIB that is given a common PWM control command that is shared by the motor control devices 31A, 31B. The common control command is a PWM signal or has a waveform of a PWM format. Both control ICs 32A, 32B have similar functions similar to the control IC 2A, 2B in the first embodiment.

Figure 16:
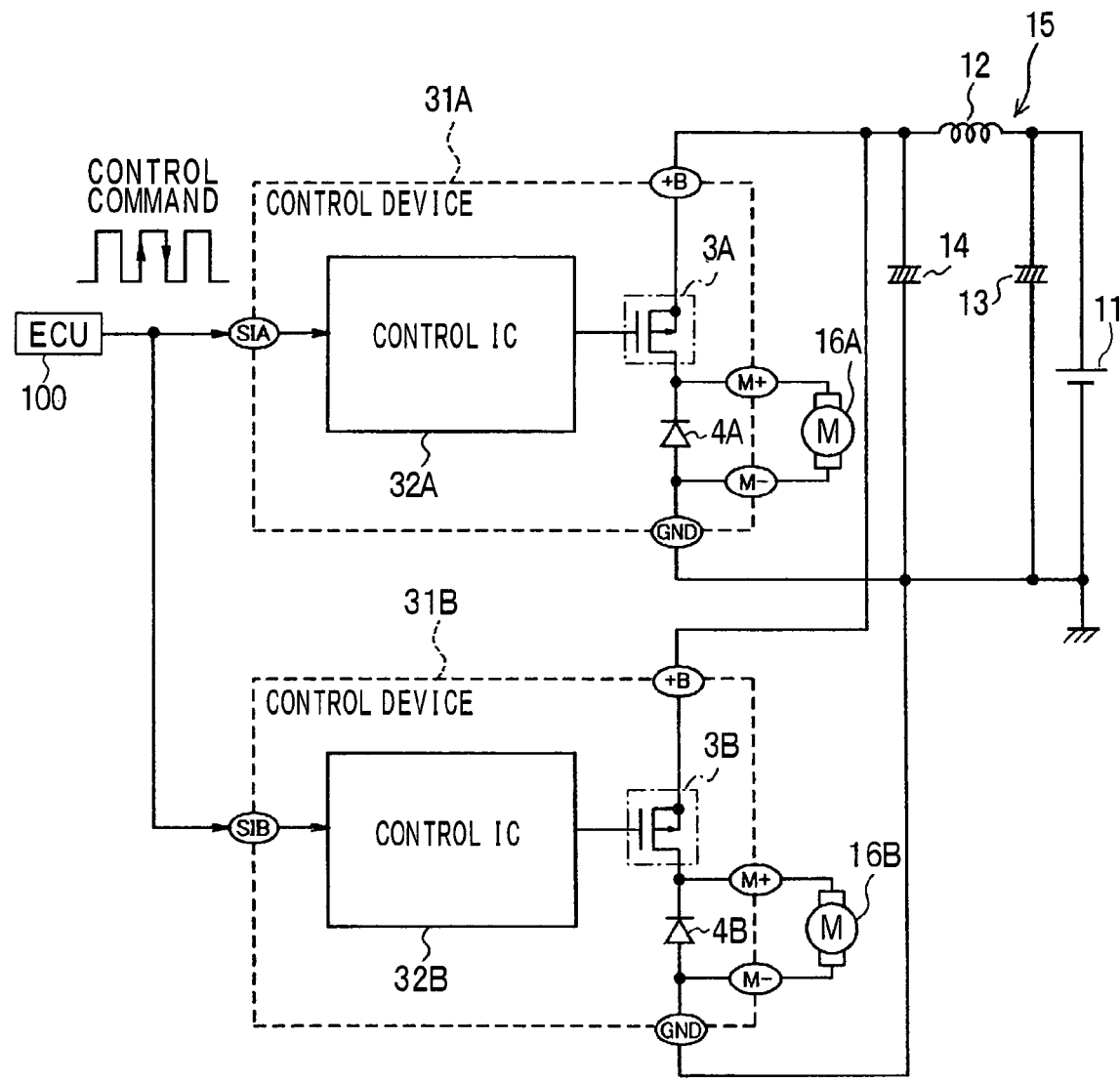
FIG. 16 is a diagram illustrating a control system having two motor control devices according to the fifth embodiment of the present invention.

Each of the control logics 5A, 5B, which are not shown in FIG. 16, of the motor control devices 31A, 31B is capable of independently setting which to use the end of the leading edge or the end of the trailing edge of the common control command as a basis of the synchronization control.

Figure 17A:
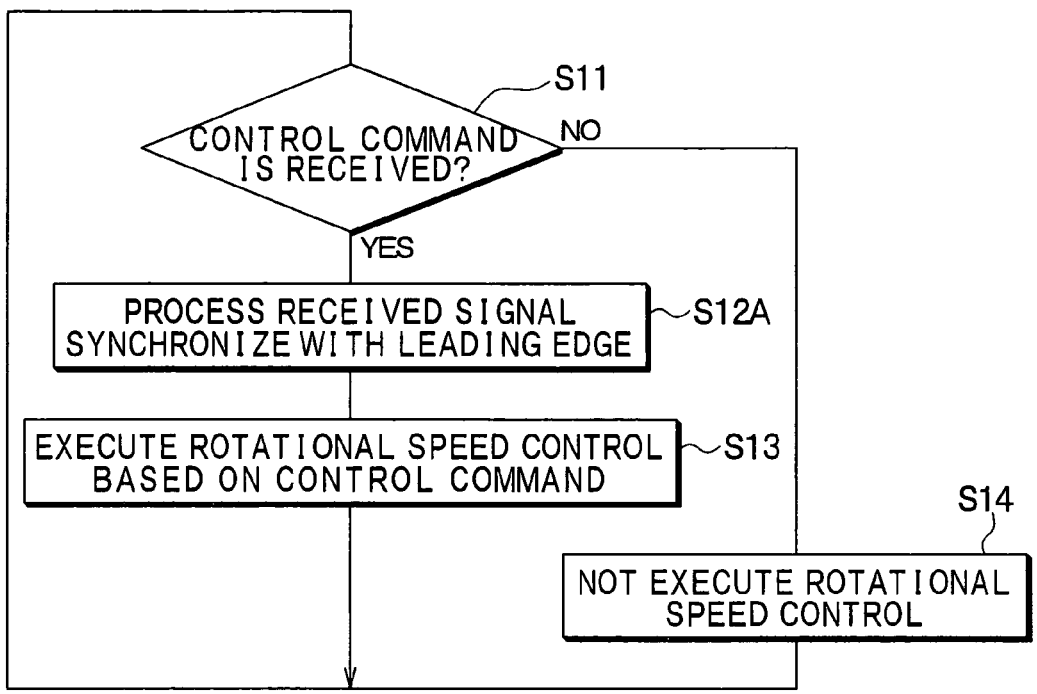
FIGS. 17A and 17B are flow charts each schematically illustrating a control process of a control logic.
Figure 17B:
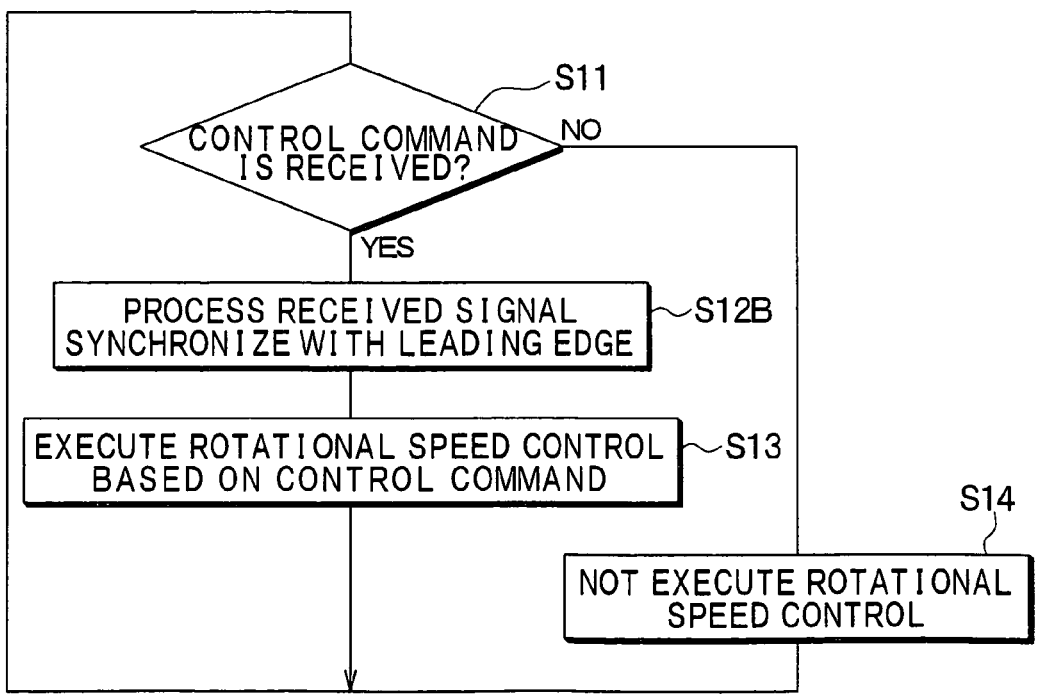

Next, operation of the fifth embodiment will be described with reference to FIG. 17A, 17B, and FIGS. 18A to 18C. FIGS. 17A and 17B are flow charts illustrating of processes executed by the control logic 5A, 5B of the motor control device 31A, 31B, respectively. More specifically, for example, in FIG. 17A, it is determined at step S11 whether a PWM control command (input signal) is received. When it is determined that the PWM control command is received, corresponding to YES at S11, for example, the motor control device 31A executes a process synchronously with the end of the leading edge of the control command at step S12A. After the execution of step S12A, control proceeds to step S13, where a rotational speed control of the motor 16A is executed based on the PWM control command. When it is determined at step S11 that the control command is not received, corresponding to NO at S11, control proceeds to step S14, where the above rotational speed control is not executed. The flow chart in FIG. 17B is executed by the control logic 5B and is generally the same with the flow chart of FIG. 17A. In step S12B in FIG. 17B, the motor control device 31B executes a process synchronously with the end of the trailing edge of the control command. After the execution of step S12B, control proceeds to step S13, where a rotational speed control of the motor 16B is executed based on the PWM control command. Other process in FIG. 17B is similar to that in FIG. 17A.

Figure 18A:
FIGS. 18A to 18C are diagrams each illustrating a PWM signal waveform when two control devices are operated under the synchronization control based on a control command of a motor.
Figure 18B:
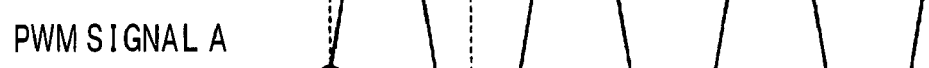
Figure 18C:
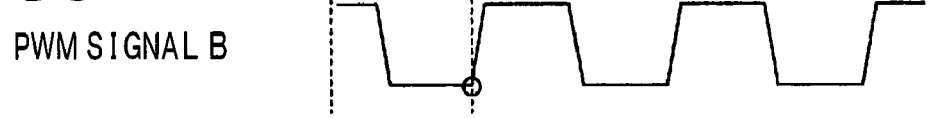

FIGS. 18A to 18C show timing charts of signals in the synchronization control of two control devices based on the control command. The motor control device 31A outputs the PWM signal A synchronously with the end of the leading edge of the PWM control command (input signal) as shown in FIG. 18B similar to the motor control device 1A of the first embodiment. Also, the motor control device 31B outputs the PWM signal B synchronously with the end of the trailing edge of the PWM control command that is received through the control command input terminal SIB of the motor control device 31B as shown in FIG. 18C.

According to the fifth embodiment, the motor control device 31A executes a control for increasing (turning on) the PWM signal A synchronously with the end of the leading edge of the PWM control command that is given to the control command input terminal SIA from the exterior. The motor control device 31B executes a control for increasing the PWM signal B synchronously with the end of the trailing edge of the control command inputted through the control command input terminal SIB. In other words, the motor control device 31A and the motor control device 31B share the same control command for the synchronization control, and use different edges of the same control command for determining timing of outputting the PWM signals. Thus, without using the specific synchronization signal that is employed in the first embodiment, the overlap of the turn,ed-6n periods and overlap of the turned-off periods are effectively prevented, and thereby the increase in the power source electric current ripple is effectively limited.

(Sixth Embodiment)

The sixth embodiment of the present invention will be described with reference to FIGS. 19, 20A to 20D, 21A, 21B. Parts different from the fifth embodiment will be mainly described. A motor control device 35 (load drive device) of the sixth embodiment has a configuration basically similar to the motor control device 31 of the fifth embodiment. The motor control device 35B of the present embodiment has a signal output terminal SOB, through which a certain signal is outputted to an exterior. The above outputted certain signal is identical with the gate signal outputted by the drive circuit 6B to the FET 3B. In other words, the gate signal is outputted through the signal output terminal SOB. Then, a motor control device 35C (third load drive device) has a control command input terminal SIC that is connected with the signal output terminal SOB of the motor control device 35B for receiving the gate signal from the motor control device 35B.

Next, operation of the sixth embodiment will be described with reference to FIGS. 20A to 20D. The motor control device 31B of the fifth embodiment has the control IC 32B that outputs the PWM signal B to the FET 3B of the motor control device 31B synchronously with the end of the trailing edge of the control command (input signal). In contrast, the motor control device 35C of the sixth embodiment has a control IC 32C that operates synchronously with the gate signal (the PWM signal B) of the motor control device 35B.

Therefore, waveforms shown in FIGS. 20A to 20C are identical with the waveforms shown in FIGS. 18A to 18C. FIG. 20D further shows a gate signal waveform, which is outputted by the motor control device 35C synchronously with the end of the trailing edge of the gate signal waveform of the motor control device 35B shown in FIG. 20C. Note that the motor control device 35C may alternatively be provided with a signal output terminal SOC, which is indicated by a dashed line in FIG. 19, similar to the configuration of the motor control device 35B. In the above alternative case, the signal output terminal SOC may be connected with a synchronization signal input terminal IN of a fourth motor control device 35 if required. As above, it is possible to operate the synchronization control for four or more motor control devices 35.

Figure 19:
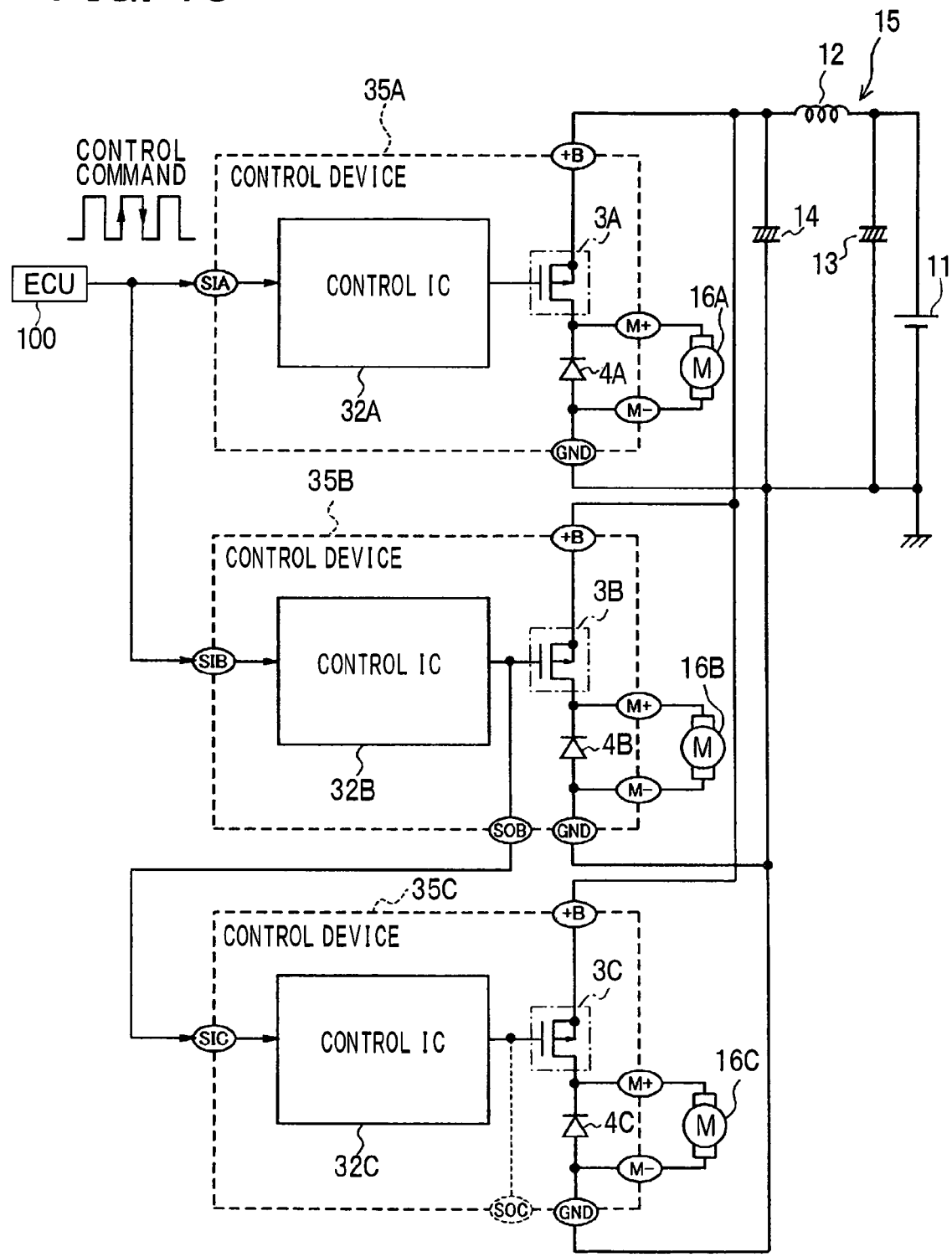
FIG. 19 is a diagram illustrating a control system having three motor control devices according to the sixth embodiment of the present invention.
Figure 22:
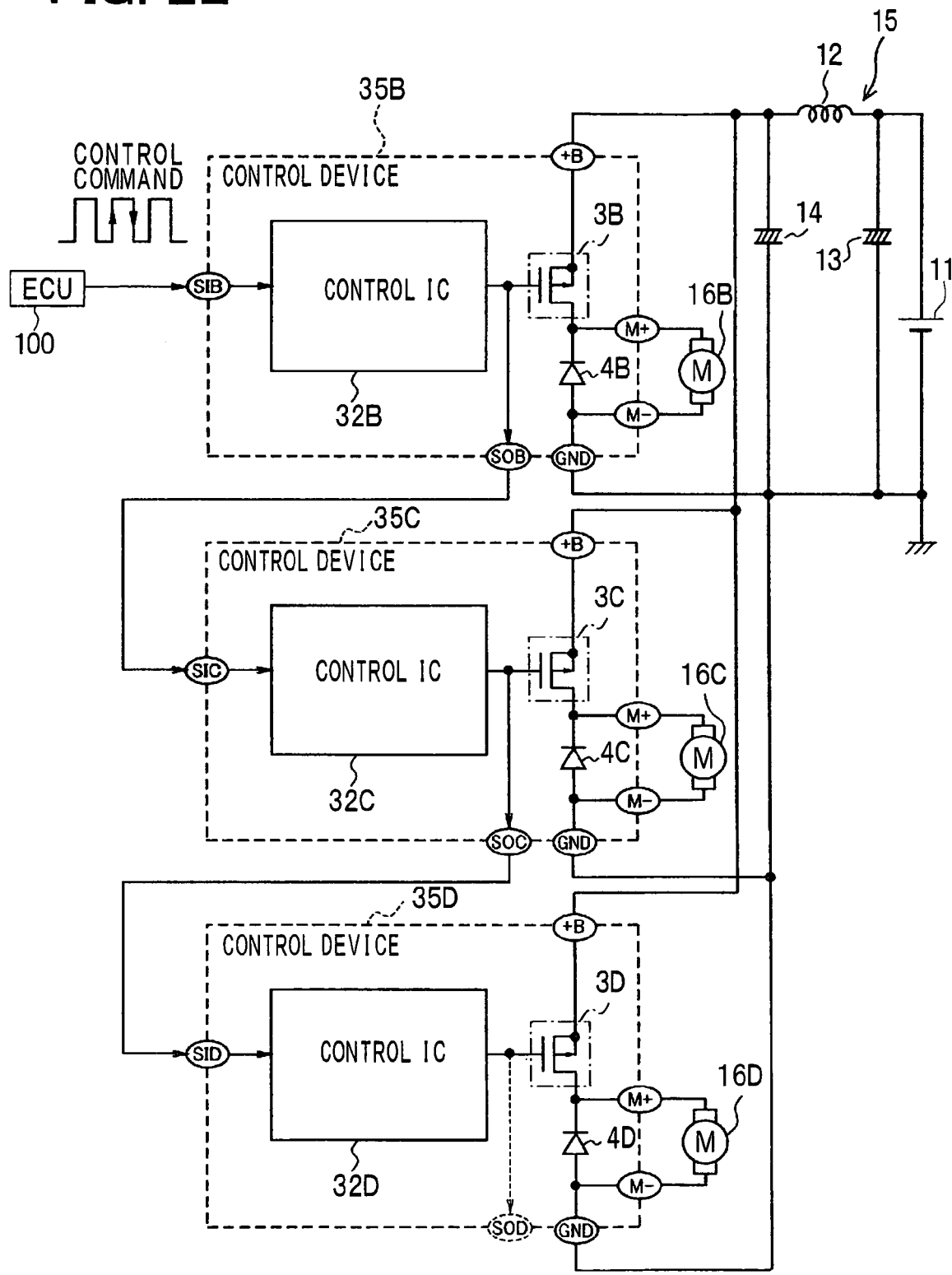
FIG. 22 is a diagram illustrating a control system having three motor control devices according to the seventh embodiment of the present invention.

Also, in FIG. 19, another example may be considered, in which the motor control device 35A is detached from the system, and thereby only the motor control devices 35B, 35C are operated. In the above example, the synchronization control of the motor control devices 35B, 35C is established as shown in FIGS. 20C and 20D. Thus, it is possible to execute the synchronization control between two devices, such as the motor control device 35B, 35C. In the above case, the motor control device 35C may be also capable of outputting the PWM signal synchronously with the end of the leading edge of gate signal waveform of the motor control device 35B as shown in FIGS. 21A and 21B. In the above alternative case, overlap of the turned-on periods and overlap of the turned-off periods are effectively prevented. The gate signal waveform of the FET 3 has the phase identical with a waveform of the voltage applied to the motor 16 by the switching control of the FET 3 based on the gate signal. Thus, the voltage signal applied to the motor 16 may be outputted instead of the gate signal.

According to the sixth embodiment, there are two motor control devices 35 (for example, the motor control devices 35B, 35C) that outputs the PWM signal synchronously with the end of the trailing edge of the control command. In the above case, the PWM control command is received through the control command input terminal SIB of the motor control device 35B, and the gate signal of the motor control device 35B is outputted through the signal output terminal SOB to the control command input terminal SIC of the motor control device 35C located downstream of the motor control device 35B. As a result, even when there are three motor control devices 35, overlap of the turned-on periods and overlap of the turned-off periods are effectively prevented, and thereby the power source electric current ripple is limited from increasing.

Also, when only the motor control devices 35B, 35C are employed, the motor control device 35C may be controlled to output the PWM signal C synchronously with the end of the leading edge of the gate signal waveform of the motor control device 35B or synchronously with the end of the trailing edge of the gate signal waveform. As a result, overlap of the turned-on periods and overlap of the turned-off periods of the motor control devices 35B, 35C are effectively prevented.

(Seventh Embodiment)

FIGS. 22, 23A to 23C, FIG. 24 illustrate the seventh embodiment of the present invention, and parts different from the sixth embodiment will be mainly described. The seventh embodiment show an example, in which an additional motor control device 35D is added to the motor control devices 35B, 35C of the sixth embodiment and thereby the synchronization control of three motor control devices is executed based on the similar manner similar to the sixth embodiment. In the present embodiment, the third motor control device 35D has a control command input terminal SID that is connected with the signal output terminal SOC of the motor control device 35C.

Figure 23A:
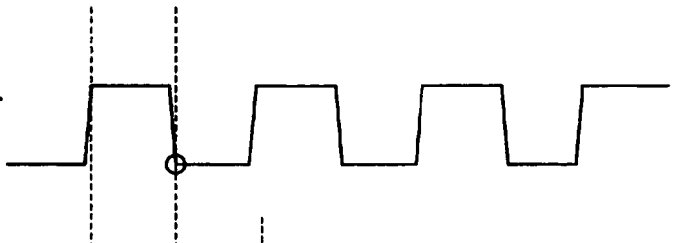
FIGS. 23A to 23C are diagrams each illustrating a PWM signal waveform when three control devices are operated under the synchronization control based on a control command of a motor.
Figure 23B:
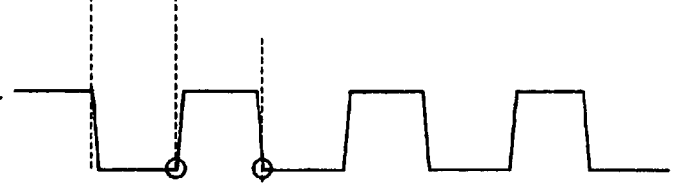
Figure 23C:
Figure 24:
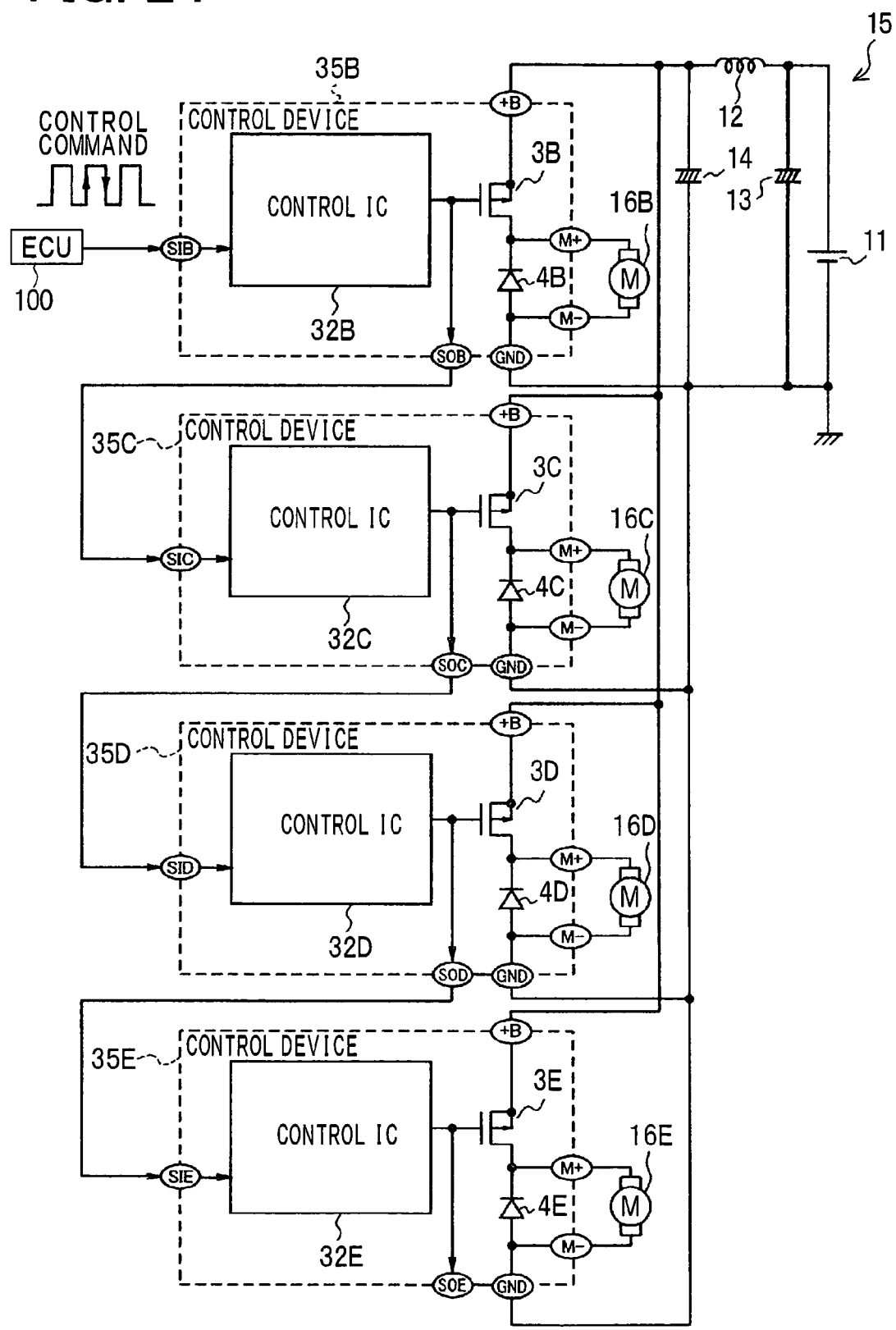
FIG. 24 is a diagram illustrating a control system having four motor control devices according to the seventh embodiment.

Next, operation of the seventh embodiment will be described with reference to FIGS. 23A to 23C and FIG. 24. Wave forms shown in FIGS. 23A and 23B are identical with the waveforms shown in FIGS. 20C and 20D. A waveform shown in FIG. 23C indicates a PWM signal D of the motor control device 35D, and the PWM signal D starts rising synchronously with the end of the trailing edge of the gate signal waveform of the motor control device 35C. Also, FIG. 24 shows a configuration, in which the synchronization control of four motor control devices 35 is executed. More specifically, an additional motor control device 35E is added to the configuration shown in FIG. 22 to constitute the new configuration that is operated in the manner similar to the configuration of FIG. 22. The motor control devices 35B to 35E are in serial connection such that the control command input terminal SI of a downstream motor control device 35 is connected with the signal output terminal SO of an upstream motor control device 35 that is located upstream of the downstream motor control device 35 sequentially.

According to the seventh embodiment, the motor control device 35B is controlled to output the PWM signal B based on the PWM control command given to the control command input terminal SIB, and the motor control device 35B simultaneously outputs a signal to the exterior through the signal output terminal SOB. For example, the control device 35B outputs the PWM signal B synchronously with the end of the leading edge of the PWM control command. The signal outputted through the signal output terminal SOB may be the PWM signal B, which is given to the gate of the FET 3B, or may be the voltage signal, which is outputted to the motor 16B. Each of the other motor control devices 35C, 35D, 35E has the control command input terminal SI that is in serial connection with the signal output terminal SO of the corresponding motor control device 35B, 35C, 35D that is located upstream thereof. Thus, each of the other motor control devices 35C, 35D, 35E executes the PWM control, in which the PWM signal is outputted synchronously with the end of the trailing edge of the PWM signal received through the control command input terminal SI. Thus, the dedicated synchronization signal that is employed in the first embodiment is not required in the present embodiment in order to prevent the overlap of the turned-on periods and the overlap of the turned-off periods, and thereby the power source electric current ripple is effectively limited from increasing.

(Other Embodiment)

The present invention is not limited to the above embodiment and to the accompanying drawings, and thus, the present invention may be modified in the following manner.

The synchronization signal outputted by the control logic 5, which serves as the master, through the synchronization signal output terminal OUT may be modified by adding the phase difference to the synchronization signal for preventing the overlap of the turned-on periods and the overlap of the turned-off periods. In the above case, the slave device that receives the modified synchronization signal may execute the synchronization control based on or synchronously with timing of the modified synchronization signal.

The third embodiment may be applied to an alternative case, where two or more motor control device serve as the slaves. In the above alternative case, multiple synchronization setting terminals M/S may be provided, for example such that a type of the slave may be set in a different manner or in multiple kinds. For example, similar to the fourth embodiment, the slave may be set as a slave A, a slave B, and the like. Then, the control logic (phase shifting means) changes the phase shift amount, which is added to the carrier wave of the PWM signal, based on the set type of the slave, such that overlap of turned-on periods and overlap of turned-off periods with the other motor control devices are prevented. In the above case, there may be provided a delay circuit that is capable of shifting the phase stepwise such that appropriate phase shift amounts are provided as required. As a result, even when multiple motor control devices serve as the slaves, different phase shift amounts are provided to the different slave carrier wave such that the overlap of the turned-on periods and the overlap of the turned-off periods are effectively prevented.

In the case of the fourth embodiment shown in FIGS. 13A to 13E, the motor control device 1B serving as the slave may output the PWM signal B for the motor control device 1B through the output terminal OUTB, and the motor control device 1C may execute the synchronization control based on the end of the leading edge of the PWM signal B similar to the second embodiment.

Alternatively, the synchronization control may be executed based on the trailing edge.

The switching element may alternatively be an N-channel MOSFET, a bipolar transistor, or an IGBT (Insulated Gate Bipolar Transistor). Also, the switching element may be applied to a low-side drive type.

In the sixth and seventh embodiments, the overlap of the turned-on periods and the overlap of the turned-off periods are prevented due to the synchronization control based on the end of the leading edge and the end of the trailing edge of the gate signal of the master. However, the synchronization control may alternatively be based on the end of the leading edge and the end of the trailing edge of the motor output signal instead of the gate signal.

The synchronization control of four or more load drive devices may be also operated in the embodiments other than the seventh embodiment.

The load is not limited to the motor, and thereby the load may be, for example, any inductive load, such as a coil, a lamp, which is operable under the PWM control.

Also, it is possible to combine all or pars of the above embodiments.

The motor control device in the above embodiments may be a molded IC.

Timing of outputting the PWM signal may be alternatively synchronized with the "start" of the leading edge (or the trailing edge) instead of the "end" of the leading edge (or the trailing edge) as required in the above embodiments in order to prevent the overlap of the turned-on periods and the turned-off periods.

Additional advantages and modifications will readily occur to those skilled in the art. The invention in its broader terms is therefore not limited to the specific details, representative apparatus, and illustrative examples shown and described.

What is claimed is:

1. A load drive device for driving an inductive load by controlling a switching element based on a pulse width modulation (PWM) signal, wherein the switching element is provided in series with the inductive load between a power source and a ground, the load drive device comprising:
synchronization control means for outputting the PWM signal to the switching element;

a synchronization signal input terminal, through which the synchronization control means is adapted to receive a synchronization signal from an exterior; and a synchronization signal output terminal, through which the synchronization control means is adapted to output the synchronization signal to an exterior, wherein:

when the synchronization control means does not receive the synchronization signal through the synchronization signal input terminal, the synchronization control means outputs the synchronization signal through the synchronization signal output terminal such that a first switching period of the PWM signal outputted to the switching element is prevented from overlapping with a second switching period of a PWM signal of an external device;

when the synchronization control means receives the synchronization signal through the synchronization signal input terminal, the synchronization control means generates the PWM signal that is outputted to the switching element based on the synchronization signal;

the synchronization control means receives a control command for controlling the inductive load, the control command having a PWM format; and when the synchronization control means does not receive the synchronization signal through the synchronization signal input terminal, both of the followings are satisfied: the synchronization control means outputs the PWM signal to the switching element synchronously with the control command; and the synchronization control means outputs a specific PWM signal as the synchronization signal through the synchronization signal output terminal, the specific PWM signal having a frequency and a duty ratio equivalent to a frequency and a duty ratio of the control command.

2. The load drive device according to claim 1, wherein:

the synchronization control means adds a phase difference to the synchronization signal outputted through the synchronization signal output terminal such that the first switching period is prevented from overlapping with the second switching period.

3. The load drive device according to claim 1, wherein:

the PWM signal has a carrier wave cycle Tp and a first duty ratio;

the synchronization control means receives a control command for controlling the load, the control command having a PWM format and having a cycle Tc and a second duty ratio;

the synchronization control means determines the first duty ratio of the PWM signal based on the second duty ratio of the control command; and the synchronization control means outputs the control command as the synchronization signal through the synchronization signal output terminal at a time that is the cycle Tc behind a time of receiving the control command.

4. The load drive device according to claim 3, wherein:

in a case where the cycle Tc is other than an integral multiple of the carrier wave cycle Tp, the synchronization control means outputs the PWM signal such that a start of the carrier wave cycle Tp of the PWM signal coincides with an end of the cycle Tc of the control command.

5. A load drive device for driving an inductive load by controlling a switching element based on a pulse width modulation (PWM) signal, wherein the switching element is provided in series with the inductive load between a power source and a ground, the load drive device comprising:

synchronization control means for outputting the PWM signal to the switching element;

a synchronization signal input terminal, through which the synchronization control means is adapted to receive a synchronization signal from an exterior; and a synchronization signal output terminal, through which the synchronization control means is adapted to output the synchronization signal to an exterior, wherein:

when the synchronization control means does not receive the synchronization signal through the synchronization signal input terminal, the synchronization control means outputs the synchronization signal through the synchronization signal output terminal such that a first switching period of the PWM signal outputted to the switching element is prevented from overlapping with a second switching period of a PWM signal of an external device;

when the synchronization control means receives the synchronization signal through the synchronization signal input terminal, the synchronization control means generates the PWM signal that is outputted to the switching element based on the synchronization signal;

the PWM signal has a carrier wave cycle Tp and a first duty ratio;

the synchronization control means receives a control command for controlling the load, the control command having a PWM format and having a cycle Tc and a second duty ratio;

the synchronization control means determines the first duty ratio of the PWM signal based on the second duty ratio of the control command; and the synchronization control means outputs the control command as the synchronization signal through the synchronization signal output terminal at a time that is the cycle Tc behind a time of receiving the control command.

6. The load drive device according to claim 5, wherein:

in a case where the cycle Tc is other than an integral multiple of the carrier wave cycle Tp, the synchronization control means outputs the PWM signal such that a start of the carrier wave cycle Tp of the PWM signal coincides with an end of the cycle Tc of the control command.

* * * * *